(12) United States Patent
Kugler et al.

(10) Patent No.: US 10,215,948 B2
(45) Date of Patent: *Feb. 26, 2019

(54) OPTICAL ELEMENT MODULE WITH MINIMIZED PARASITIC LOADS

(71) Applicant: Carl Zeiss SMT GmbH, Oberkochen (DE)

(72) Inventors: Jens Kugler, Aalen (DE); Ulrich Weber, Ulm (DE); Dirk Schaffer, Jena (DE)

(73) Assignee: Carl Zeiss SMT GmbH, Oberkochen (DE)

(*) Notice: Subject to any disclaimer, the term of this patent is extended or adjusted under 35 U.S.C. 154(b) by 251 days.

This patent is subject to a terminal disclaimer.

(21) Appl. No.: 13/690,227

(22) Filed: Nov. 30, 2012

(65) Prior Publication Data

US 2013/0100547 A1 Apr. 25, 2013

Related U.S. Application Data

(63) Continuation of application No. 12/708,034, filed on Feb. 18, 2010, now Pat. No. 8,351,139, which is a continuation of application No. PCT/EP2007/058787, filed on Aug. 23, 2007.

(51) Int. Cl.
*G02B 7/02* (2006.01)
*G03F 7/20* (2006.01)

(52) U.S. Cl.
CPC ............ *G02B 7/02* (2013.01); *G02B 7/021* (2013.01); *G03F 7/70825* (2013.01)

(58) Field of Classification Search
CPC ........ G02B 7/02; G02B 7/021; G03F 7/70825

USPC .......................................... 359/811, 818, 819
See application file for complete search history.

(56) References Cited

U.S. PATENT DOCUMENTS

| | | | |
|---|---|---|---|
| 4,420,223 A | 12/1983 | Watanabe et al. | |
| 5,822,133 A | 10/1998 | Mizuno et al. | |
| 6,229,657 B1 | 5/2001 | Holderer et al. | |
| 6,239,924 B1* | 5/2001 | Watson et al. | 359/819 |
| 6,400,516 B1 | 6/2002 | Spinali | |
| 6,859,337 B2 | 2/2005 | Oshino et al. | |
| 6,922,293 B2 | 7/2005 | Watson et al. | |
| 7,154,684 B2 | 12/2006 | Shibazaki | |

(Continued)

FOREIGN PATENT DOCUMENTS

| | | |
|---|---|---|
| EP | 1 081 521 | 3/2001 |
| EP | 1 179 746 | 2/2002 |

(Continued)

OTHER PUBLICATIONS

International Search Report and a Written Opinion from the counterpart PCT Application No. PCT/EP2007/058787, filed Aug. 23, 2007.

(Continued)

*Primary Examiner* — Aliciia M Harrington
(74) *Attorney, Agent, or Firm* — Fish & Richardson P.C.

(57) ABSTRACT

An optical element module includes an optical element unit and a support structure. The optical element module includes an optical element. The support structure includes a support device and a contact device connected to the support device. A surface of the contact device contacts a surface of the optical element unit and exerts a holding force on the optical element unit along a holding force direction.

25 Claims, 11 Drawing Sheets

(56) References Cited

U.S. PATENT DOCUMENTS

| | | |
|---|---|---|
| 8,351,139 B2 | 1/2013 | Kugler et al. |
| 2002/0085291 A1 | 7/2002 | Dieker |
| 2002/0163741 A1 | 11/2002 | Shibazaki |
| 2002/0176094 A1 | 11/2002 | Petasch et al. |
| 2003/0147155 A1 | 8/2003 | Nishikawa |
| 2003/0169517 A1 | 9/2003 | Weber |
| 2003/0234989 A1 | 12/2003 | Oshino et al. |
| 2004/0008429 A1 | 1/2004 | Watson et al. |
| 2004/0212794 A1 | 10/2004 | Mizuno |
| 2006/0066963 A1 | 3/2006 | Sudoh |
| 2007/0014037 A1 | 1/2007 | Frommeyer et al. |
| 2008/0291555 A1 | 11/2008 | Okada |
| 2009/0284849 A1 | 11/2009 | Schoeppach et al. |
| 2010/0214675 A1 | 8/2010 | Kugler et al. |

FOREIGN PATENT DOCUMENTS

| | | |
|---|---|---|
| EP | 1 326 114 | 7/2003 |
| JP | 57-90607 | 6/1982 |
| JP | 62-11802 | 1/1987 |
| JP | 11-231192 A | 8/1999 |
| JP | 2000-028886 | 1/2000 |
| JP | 2001-074991 | 3/2001 |
| JP | 2001-215377 | 8/2001 |
| JP | 2002-107595 | 4/2002 |
| JP | 2002-131605 | 5/2002 |
| JP | 2002-162549 | 6/2002 |
| JP | 2002-236242 | 8/2002 |
| JP | 2002-244008 | 8/2002 |
| JP | 2004-031491 | 1/2004 |
| JP | 2004-340372 | 12/2004 |
| JP | 2006-100315 | 4/2006 |
| JP | 2006-349946 A | 12/2006 |
| JP | 2008-009381 | 1/2008 |
| TW | 490599 | 6/2002 |
| TW | 548525 | 8/2003 |
| WO | WO 02/016992 | 2/2002 |

OTHER PUBLICATIONS

International Preliminary Report on Patentability for the corresponding PCT Application No. PCT/EP2007/058787, dated Feb. 24, 2010.

Japanese Office Action, with translation thereof, for corresponding JP Appl No. 2012-239984, dated May 14, 2013.

Japanese Office Action, with translation thereof, for corresponding JP Appl No. 2012-239984, dated May 20, 2014.

Taiwanese Office Action, with summary thereof, for TW Appl No. 97132187, dated Jun. 20, 2014.

Taiwanese Office Action and Search Report, with translation thereof, for corresponding TW Appl No. 104105792, dated Jul. 21, 2016.

Japanese Office Action, with translation thereof, for corresponding JP Appl No. 2015-230218, dated Sep. 29, 2016.

Japanese Office Action, with translation thereof, for corresponding JP Appl No. 2017-211977, dated Nov. 30, 2018.

\* cited by examiner

OPTICAL ELEMENT MODULE WITH MINIMIZED PARASITIC LOADS

CROSS-REFERENCE TO RELATED APPLICATIONS

This application is a continuation of, and claims benefit under 35 USC 120 to, U.S. application Ser. No. 12/708,034, filed Feb. 18, 2010, now U.S. Pat. No. 8,351,139, which is a continuation of international application PCT/EP2007/058787, filed Aug. 23, 2007. U.S. application Ser. No. 12/708,034 and international application PCT/EP2007/058787 are hereby incorporated by reference in their entirety.

FIELD

The disclosure relates to optical element modules. The optical modules may be used within optical exposure devices, such as a microlithography systems, which may be used in exposure processes, such as microlithography exposure processes. The disclosure also relates to optical imaging arrangements that include such an optical element module. The disclosure further relates to methods of holding an optical element unit using a holding force. The disclosure may be used in the context of photolithography processes for fabricating microelectronic devices, such as semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element modules including optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element module groups.

With such optical systems, typically, such optical element module groups are often built from a stack of optical element modules holding one or more—typically but not necessarily rotationally symmetric—optical elements. These optical element modules usually include an external generally ring shaped support structure supporting one or more optical element holders each, in turn, holding one or more optical elements.

Due to the ongoing miniaturization of semiconductor devices there is a desire for enhanced resolution of the optical systems used for fabricating those semiconductor devices. This desire for enhanced resolution obviously pushes the desire for an increased imaging accuracy of the optical system. Furthermore, to reliably obtain high-quality semiconductor devices it is not only desirable to provide an optical system showing a high degree of imaging accuracy. It is also desirable to maintain such a high degree of accuracy throughout the entire exposure process and over the lifetime of the system. As a consequence, the components of the optical system cooperating in the exposure process desirably are supported in a defined manner in order to provide and maintain a predetermined spatial relationship between the optical system components which, in turn, guarantees a high quality exposure process.

In order to reduce imaging errors that may arise during operation of the optical system, it is known to actively control the position of one or more of the optical elements of the optical system. Such an optical system is known, for example, from U.S. Pat. No. 5,822,133 (Mizuno et al.), the entire disclosure of which is incorporated herein by reference.

It is also proposed to actively deform some of the optical elements, i.e. actively control the geometry of some of the optical elements.

A special focus may be put on the design of the contact elements of the support structure contacting the optical element or an eventual holder holding the optical element (in an optical element unit including the optical element and such a holder).

A typical support structure for an optical element used in the context of such optical systems is known, for example, from U.S. Pat. No. 7,154,684 B2 (Shibazaki), the entire disclosure of which is incorporated herein by reference.

SUMMARY

In some embodiments, the disclosure can provides an optical element module and a method of holding an optical element unit providing a reliable reduction of parasitic loads and contact stress introduced into the optical element.

In certain embodiments, the disclosure provides an optical element module and a method of holding an optical element unit allowing a simple reduction of parasitic loads introduced into the optical element.

In some embodiments, the disclosure reduces the effort involved with an optical device used in an exposure process for providing a high imaging accuracy during operation of the optical device.

The disclosure is based on the teaching that a simple and effective reduction of parasitic loads introduced into an optical element via its support structure is possible if the respective contact device of the support structure contacting the optical element unit (including an optical element) is arranged in such a manner that an elastically deformable part of the contact device due to its elastic deformation defines a motion (such as, type of motion and instantaneous center of motion, respectively) of the contact surface of the respective contact device which is induced by the actual contact forces and which is as close as possible to actual motion of the contact surface restricted due to the frictional contact between the contact device and the optical element unit.

In other words, embodiments of the present disclosure aim to match (as far as possible) the motion of the contact surface of the contact device defined by the contact device in response to a (theoretical) frictionless contact to the actual motion resulting from the (real) frictional contact. Such a deviation between the theoretical motion and the actual motion otherwise would have to be compensated by an elastic deformation of at least one of the contact partners leading to a prestress within the respective contact partner and, thus, to a parasitic load introduced into the optical element.

To this end, the elastically deformable part of the contact device may be designed and arranged such that, upon a proper contact between the two contact surfaces, a tilting moment about a tilting axis parallel to the contact surfaces is at least minimized leading to a reduction of the deviation between the theoretical and actual motion. Furthermore, the elastically deformable part of the contact device may be designed and arranged such that, upon an initial (e.g. angular) misalignment between the contact surfaces, the instantaneous center of motion is located as close as possible to both contact surfaces also leading to a reduction of the deviation between the theoretical and actual motion.

In some embodiments, the disclosure provides an optical element module including an optical element unit including an optical element and a support structure. The support structure supports the optical element unit and includes a support device and a contact device mounted to the support device. The contact device exerts a resulting holding force onto the optical element unit in a first direction via a first contact surface of the contact device. The first contact surface contacts a second contact surface of the optical element unit. The contact device includes a first linking section and a second linking section extending along a second direction running transverse to the first direction and arranged kinematically in series between the first contact surface and the support device. The first linking section and the second linking section are elastically deformed in response to a bending moment resulting from the resulting holding force. The first linking section and the second linking section are arranged on opposite sides of a reference plane. The reference plane includes the resulting holding force and running transverse to the second direction.

In certain embodiments, the disclosure provides an optical element module including an optical element unit including an optical element and a support structure. The support structure supports the optical element unit and includes a support device and a contact device mounted to the support device. The contact device exerts a resulting holding force onto the optical element unit via a first contact surface of the contact device. The first contact surface contacts a second contact surface of the optical element unit and the resulting holding force having a line of action extending in a first direction. The contact device includes at least one linking section arranged between the first contact surface and the support device and extending along a second direction running transverse to the first direction. The at least one linking section, in response to the resulting holding force, experiences a bending moment about a bending axis running transverse to a bending plane. The bending plane is defined by the first direction and the second direction. The at least one linking section is arranged such that, along the second direction, the bending moment changes from a positive value to a negative value at a point of zero bending moment. The point of zero bending moment, along the second direction, is at least one of located close to a reference plane and located substantially within a reference plane. The reference plane is defined by the line of action of the resulting holding force and a direction of the bending axis.

In some embodiments, the disclosure provides an optical element module including an optical element unit including an optical element and a support structure. The support structure supports the optical element unit and includes a contact device and a support device. The contact device includes a contact element, a mounting element connected to the support device and at least one linking element fixedly connected at a first end to the contact element and at a second end to the mounting element. The contact element includes a first contact surface exerting a contact pressure on a second contact surface of the optical element unit when the mounting element is mounted to the support device. The at least one linking element is deformable in such a manner that the contact pressure has a substantially even distribution over the second contact surface.

In certain embodiments, the disclosure provides an optical element module including an optical element unit including an optical element and a support structure supporting the optical element unit. The support structure includes at least one contact device exerting a holding force onto the optical element unit in a holding force direction via a first contact surface of the at least one holding device. The first contact surface contacts a second contact surface of the optical element unit. The at least one holding device is arranged to define a tilt axis of a tilt motion of the first contact surface. The tilt motion results from a tilt moment due to a contact force introduced into the first contact surface along the holding force direction. The tilt axis is at least one of located close to the first contact surface and located substantially within the first contact surface.

In some embodiments, the disclosure provides an optical element module including an optical element unit including an optical element and a support structure. The support structure includes a support device and a contact device connected to the support device. The contact device exerts a holding force onto the optical element unit in a holding force direction via a first contact surface of the contact device. The first contact surface contacts a second contact surface of the optical element unit. The contact device includes a first linking section and a second linking section being arranged kinematically in series between the first contact surface and the support device such that a first end of the first linking section is located adjacent to the first contact surface and a second end of the first linking section is located adjacent to the second linking section. The first linking section and the second linking section are arranged to undergo a deflection in response to a contact force introduced into the first contact surface along the holding force direction. The deflection of the first linking section is such that at least a first excursion of the first end is opposite to at least a second excursion of the first end resulting from the deflection of the second linking section. The first and second excursion are one of a translational excursion along the first direction, a translational excursion along the second direction and a rotational excursion about an axis running transverse to the first and second direction.

In certain embodiments, the disclosure provides an optical imaging device including an illumination device, a mask device adapted to receive a mask, an optical projection device and a substrate device adapted to receive a substrate. The illumination device is adapted to illuminate a pattern formed on the mask while the optical projection device is adapted to project an image of the pattern onto the substrate. At least one of the illumination device and the optical projection device includes an optical element module according to the disclosure.

In some embodiments, the disclosure provides a method of holding an optical element unit using a holding force including providing the optical element unit including an optical element, a support device and a contact device exerting the holding force in a first direction on the optical element unit along a line of action. The contact device includes a first linking section and a second linking section arranged kinematically in series between the optical element unit and the support device and extending along a second direction running transverse to the first direction. The method also includes arranging the first linking section and the second linking section on opposite sides of a reference plane. The reference plane including the holding force and running transverse to the second direction. The method further includes exerting the holding force in such a manner that the first linking section and the second linking section are elastically deformed in response to the holding force.

In certain embodiments, the disclosure provides a method of holding an optical element unit using a holding force including providing the optical element unit including an optical element, a support device and a contact device exerting the holding force in a first direction on the optical element unit along a line of action. The contact device includes at least one linking section arranged between the optical element unit and the support device and extending along a second direction running transverse to the first direction. The method also includes arranging the at least one linking section and exerting the holding force in such a manner that the at least one linking section experiences a bending moment about a bending axis running transverse to a bending plane. The bending plane is defined by the first direction and the second direction. The bending moment, along the second direction, changes from a positive value to a negative value at a point of zero bending moment, the point of zero bending moment, along the second direction, at least one of located close to a reference plane and located substantially within a reference plane. The reference plane is defined by the line of action of the resulting holding force and a direction of the bending axis.

In some embodiments, the disclosure provides a method of holding an optical element unit using a contact pressure including providing the optical element unit including an optical element, a support device and a contact device exerting the contact pressure on the optical element unit. The contact device includes a contact element, a mounting element connected to the support device and at least one linking element being elastically deformable and fixedly connected at a first end to the contact element and at a second end to the mounting element. The method also includes arranging the at least one linking element and exerting the contact pressure via the contact element in such a manner that the contact pressure has a substantially even distribution over the second contact surface.

In certain embodiments, the disclosure provides a method of holding an optical element unit using a holding force including providing the optical element unit including an optical element and a holding device exerting the holding force in a holding force direction on the optical element unit. The holding device includes a first contact surface exerting the holding force on a second contact surface of the optical element unit, and arranged to define a tilt axis of a tilt motion of the first contact surface, the tilt motion resulting from a contact force introduced into the first contact surface along the holding force direction. The method also includes locating the tilt axis at least one of close to the first contact surface and substantially within the first contact surface. The method further includes exerting the holding force on the optical element unit.

In some embodiments, the disclosure provides a method of holding an optical element unit using a holding force including providing the optical element unit including an optical element, a support device and a contact device exerting the holding force in a holding force direction via a first contact surface on a second contact surface of the optical element unit. The contact device includes a first linking section and a second linking section arranged kinematically in series between the first contact surface and the support device such that a first end of the first linking section is located adjacent to the first contact surface and a second end of the first linking section is located adjacent to the second linking section. The method also includes arranging the first linking section and the second linking section such that they undergo a deflection in response to a contact force introduced into the first contact surface along the holding force direction. The deflection of the first linking section is such that at least a first excursion of the first end is opposite to at least a second excursion of the first end resulting from the deflection of the second linking section. The first and second excursion is one of a translational excursion along the first direction, a translational excursion along the second direction and a rotational excursion about an axis running transverse to the first and second direction. The method further includes exerting the holding force.

Further aspects and embodiments of the disclosure will become apparent from the dependent claims and the following description of embodiments which refers to the appended figures. All combinations of the features disclosed, whether explicitly recited in the claims or not, are within the scope of the disclosure.

DETAILED DESCRIPTION

First Exemplary Embodiment

In the following, an exemplary embodiment of an optical imaging arrangement 101 according to the disclosure will be described with reference to FIGS. 1 to 5.

Figure 1:
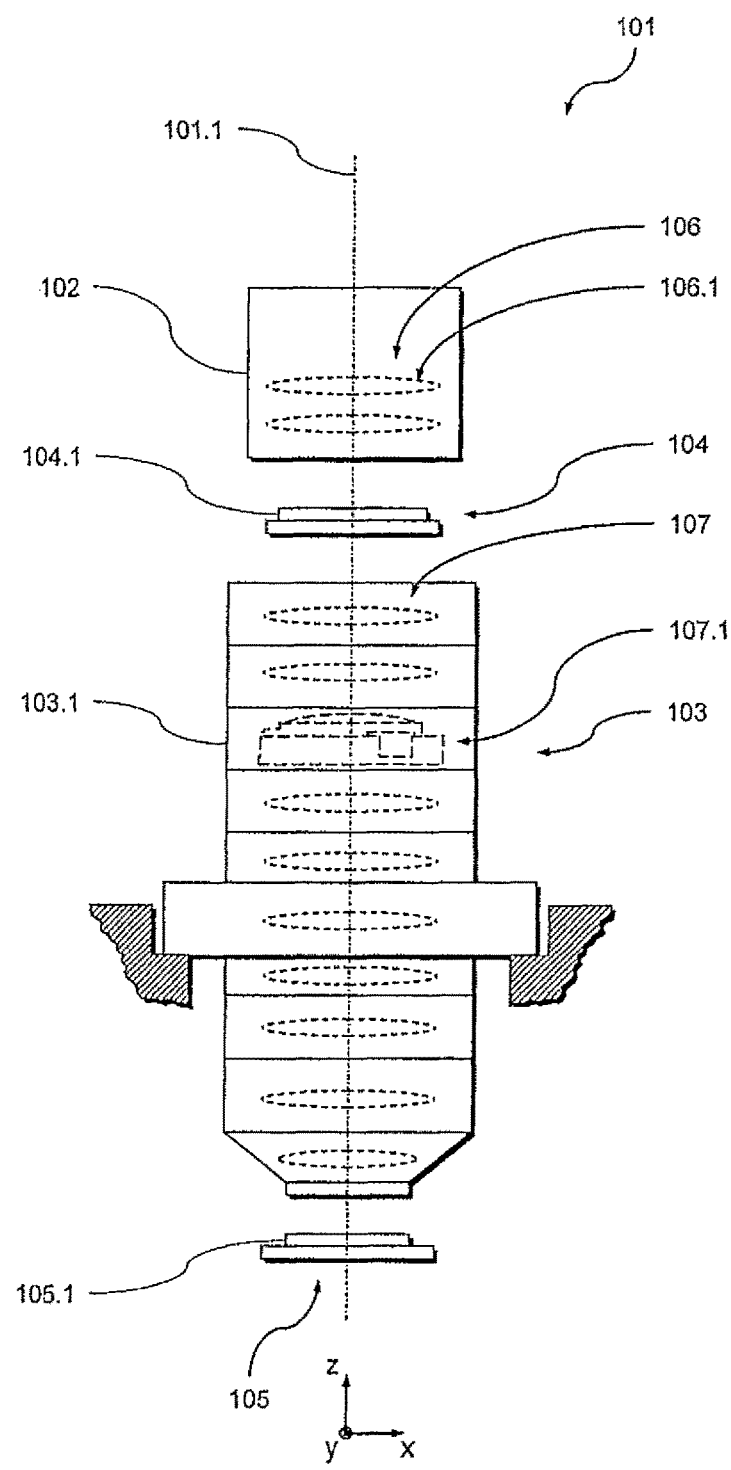
FIG. 1 is a schematic representation of an embodiment of an optical imaging arrangement according to the disclosure which includes an optical element module according to the disclosure with which embodiments of a method according to the disclosure may be executed.

FIG. 1 is a schematic and not-to-scale representation of the optical imaging arrangement in the form of an optical exposure apparatus 101 used in a microlithography process during manufacture of semiconductor devices. The optical exposure apparatus 101 includes a first optical device in the form of an illumination unit 102 and a second optical device in the form of an optical projection unit 103 adapted to transfer, in an exposure process, an image of a pattern formed on a mask 104.1 of a mask unit 104 onto a substrate 105.1 of a substrate unit 105.

To this end, the illumination unit 102 illuminates the mask 104.1 with exposure light at a wavelength of 193 nm. However, it will be appreciated, that the disclosure may also be used in an exposure apparatus using light of any other wavelength. In particular, the disclosure may also be used and highly beneficial in the context of so-called extreme UV (EUV) systems using light in the extreme UV range at wavelengths below 20 nm, typically about 13 nm.

The optical projection unit 103 receives the exposure light coming from the mask 104.1 and projects the image of the pattern formed on the mask 104.1 onto the substrate 105.1, e.g. a wafer or the like. However, it will be appreciated that the disclosure may also be used in the context of any other optical system where optical elements are to be held in well-defined positions.

The illumination unit 102 includes a light source (not shown) and an optical element system 106 including a plurality of optical element modules such as optical element module 106.1. The optical projection unit 103 includes a further optical element system 107 including a plurality of optical element modules 107.1. The optical element modules of the optical element systems 106 and 107 are aligned along an (eventually folded) optical axis 101.1 of the optical exposure apparatus 101 and may include any type of optical element, such as lenses, mirrors, gratings or the like.

The optical element system 107, for example, is held by a stack of optical element modules held within the housing 103.1 of the optical element system 107. The optical element modules of the optical element system 107 include an optical element module 107.1 according to the disclosure.

For the reasons of an easier understanding of the following description an orthogonal coordinate system (xyz) is given in the Figures (and will be referred to in the following) wherein the z-direction designates a vertical direction whereas the x- and y-direction designate horizontal directions. However, it will be appreciated that, with other embodiments of the disclosure, any other spatial orientation of the components described in the following may be selected.

Figure 2:
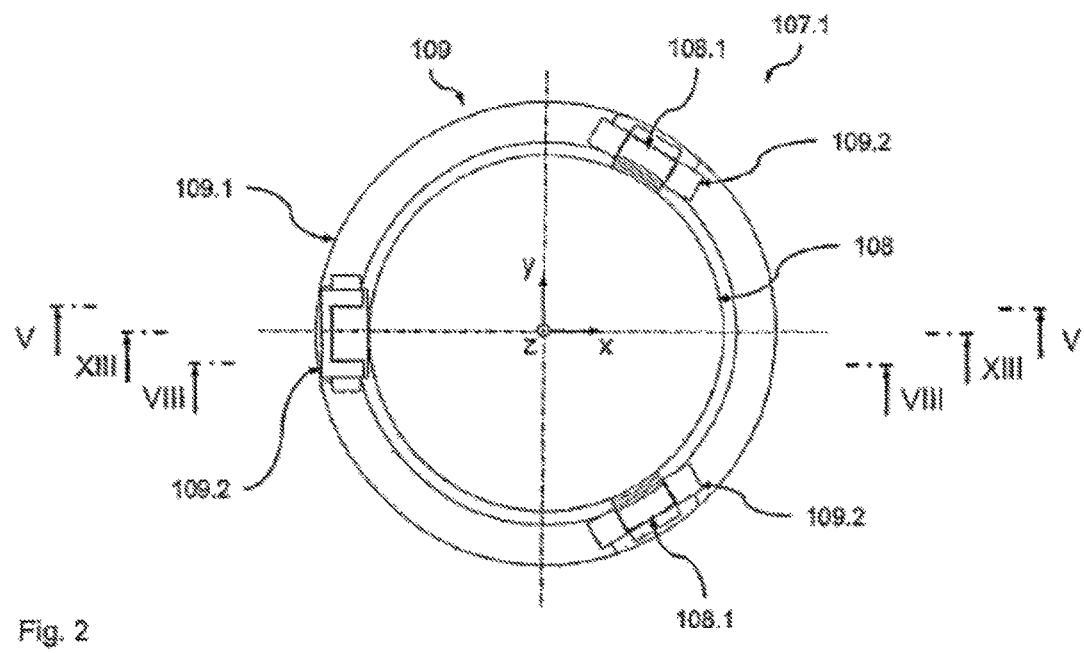
FIG. 2 is a schematic top view of an optical element module being a part of the optical imaging arrangement of FIG. 1.

As may be seen from FIG. 2 (showing a top view of the optical element module 107.1) the optical element module 107.1 includes an optical element unit in the form of a simple lens 108 supported and held by a support structure 109. However, it will be appreciated that, with other embodiments of the disclosure, the optical element unit may include further components (e.g. a separate holding element such as a separate holding ring directly contacting the optical element and, in turn, contacted by the support structure 109). In other words, the support structure 109 doesn't have to contact the optical element directly but may support and hold the optical element via such an intermediate element or device.

In the exemplary embodiment shown, the support structure 109 includes a support device in the form of a support ring 109.1 as well as three lens holders 109.2. Each lens holder 109.2 is arranged within a suitable recess within the support ring 109.1. Each lens holder 109.2 is mounted to the support ring 109.1 and (as will be described in further detail below) contacts a radial protrusion 108.1 of the lens 108.

The lens holders 109.2, in the exemplary embodiment shown, are of identical design. However, it will be appreciated that, with other embodiments of the disclosure, holders of different design may be combined as well. Furthermore, it will be appreciated that, with other embodiments of the disclosure, and any other desired number of lens holders may be used for supporting and holding an optical element.

Each lens holder 109.2 includes a first contact device in the form of a lens support 109.3 as well as a second contact device in the form of a clamp 109.4. It should be noted that in FIGS. 2 and 3 only for the lens holder 109.2 on the left-hand side both components (lens support 109.3 and clamp 109.4) are shown while for the other two lens holders 109.2 (on the right-hand side) only the lens support 109.3 is shown.

The lens holders 109.2 are evenly distributed at the outer circumference of the lens 108. However, it will be appreciated that, with other embodiments of the disclosure, any other arrangement of the lens holders and the outer circumference of the lens may be selected. In particular, for non rotationally symmetric optical elements any other suitable arrangement of such holders may be chosen.

Figure 3:
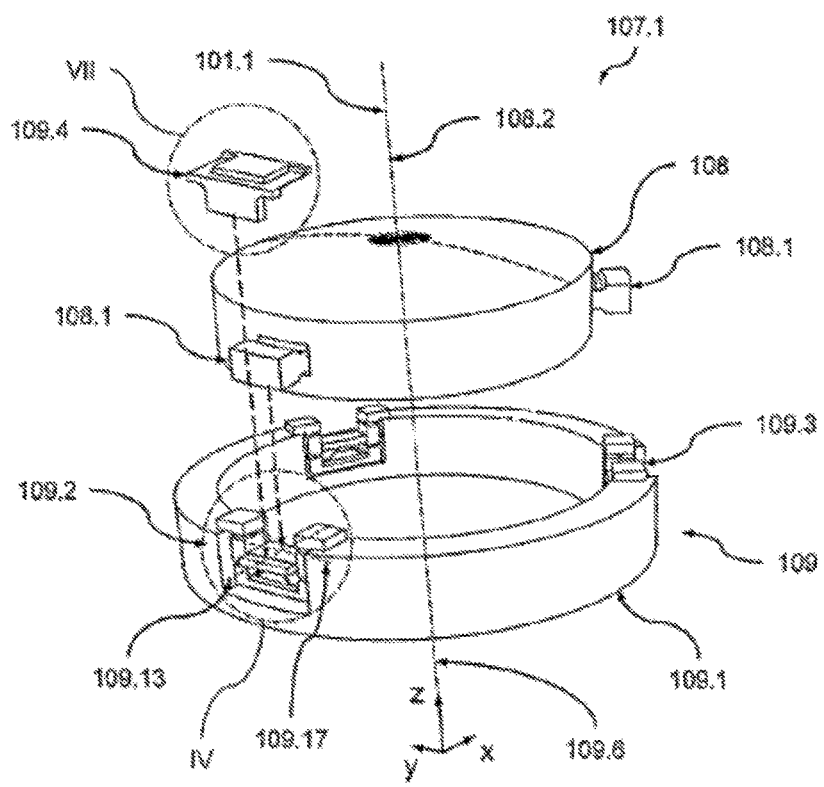
FIG. 3 is a schematic perspective exploded view of the optical element module of FIG. 2.
Figure 4:
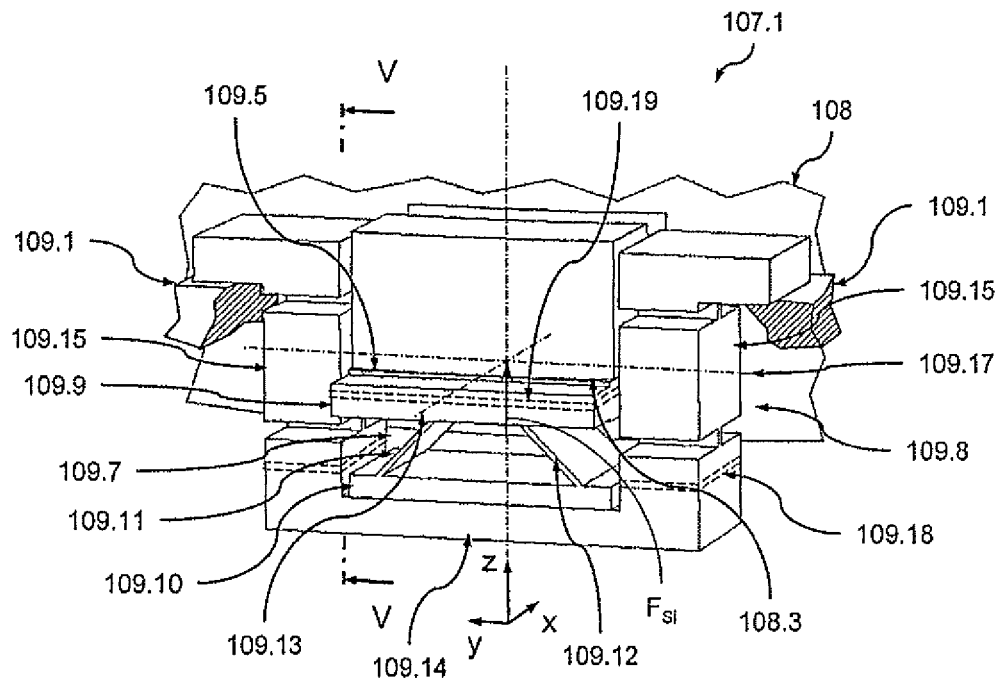
FIG. 4 is a schematic partially sectional view of the detail IV of the optical element module of FIG. 2 in a partially assembled state.
Figure 8:
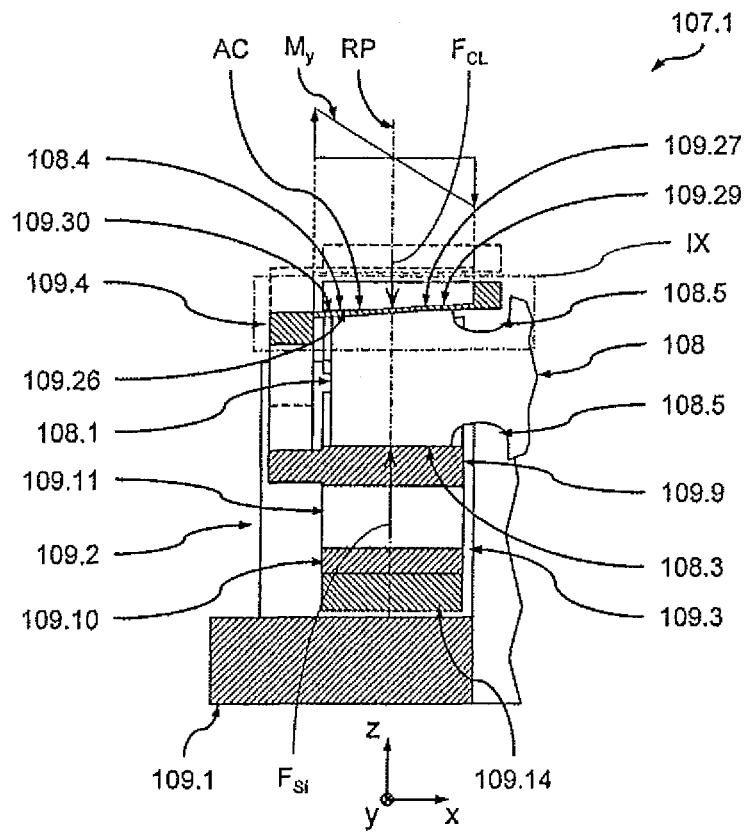
FIG. 8 is a schematic sectional view along line VIII-VIII of FIG. 2.

As may be seen from FIGS. 3, 4 and 8, each lens support 109.3 provides a first contact surface in the form of a support surface 109.5. As can be seen best from FIG. 3, when mounting the lens 108 to the support structure 109 the lens 108 is moved along its optical axis 108.2 (which later typically coincides with the optical axis 101.1 of the microlithography device 101) until a second contact surface in the form of a lower lens contact surface 108.3 of the respective radial protrusion 108.1 of the lens 108 contacts the support surface 109.5 of the assigned lens support 109.3.

Thus, each lens support 109.3, at this stage of assembly, via its support surface 109.5 exerts a holding force in the form of a support force $F_{Si}$ along a holding force direction (z-direction) on the assigned lower lens contact surface 108.3. In the exemplary embodiment shown, the support forces $F_{Si}$ counteract and fully compensate the gravitational force G acting on the lens 108. However, it will be appreciated that, with other embodiments of the disclosure, further support components may be provided partially counteracting the gravitational force acting on the lens. For example, a large number of small spring elements may be distributed at the outer circumference of the lens, each exerting a small support force on the lens such that, at least a part of the gravitational force acting on the lens is compensated by these spring elements.

Figure 5:
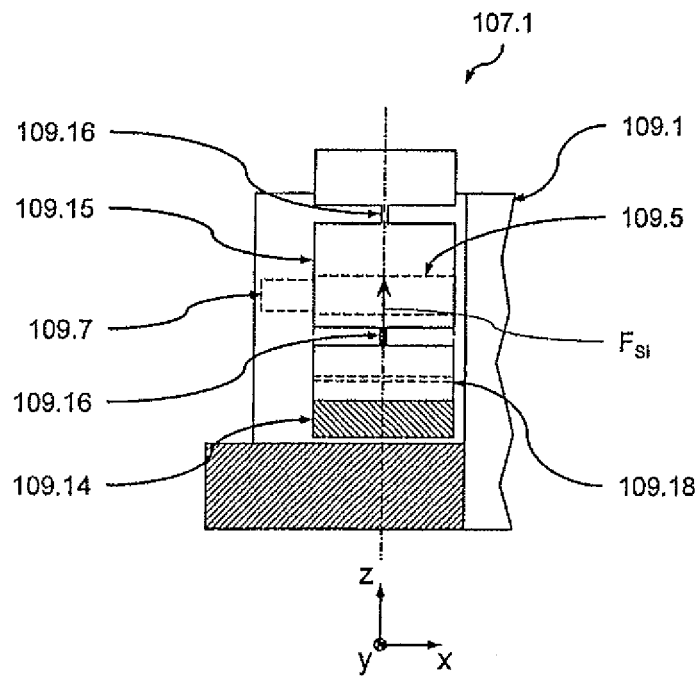
FIG. 5 is a schematic sectional view along line V-V of FIG. 2.

As can be seen from FIGS. 4 and 5, the respective lens support 109.3 includes a first linking section in the form of a first lens support element 109.7 and a second linking section in the form of a generally U-shaped second lens support element 109.8. The second lens support element has a plane of main extension which is tangential to the circumferential direction of the support ring 109.1 and, consequently, tangential to the circumferential direction of the lens 108 (in its mounted state).

The first lens support element 109.7 forms a first contact element which, at a first end, has a first contact element part 109.9 providing the support surface 109.5. At a second end, the first lens support element 109.7 has a second contact element part 109.10 which is connected to the first contact element part 109.9 via a connecting part 109.11.

The connecting part 109.11 of the first lens support element 109.7 is formed by two first leaf spring elements 109.12 which are arranged such that their planes of main extension intersect at a line of intersection 109.13 which runs in the radial direction of the support ring 109.1 and lies within the contact plane (for the lower lens contact surface 108.3) defined by the support surface 109.5. The two leaf spring elements 109.12 define a first tilt axis of the support surface 109.5 corresponding to be line of intersection 109.13 of their planes of main extension. The function of this first tilt axis 109.13 will be explained in further detail below.

The second contact element part 109.10 is mounted to the base section 109.14 of the U-shaped second lens support element 109.8. The free ends of the two legs 109.15 of the second lens support element 109.8 in turn are mounted to the support ring 109.1. Thus, the first lens support element 109.7 and the second lens support element 109.8 are arranged kinematically in series between the support surface in 109.5 and the support ring 109.1.

The respective leg 109.15 extends along the holding force direction and includes two second leaf spring elements 109.16. The second leaf spring elements 109.16 are spaced from each other and (at least in an unloaded state of the lens support 109.2) have a common plane of main extension which is also arranged tangential to the circumferential direction of the support ring 109.1. In relation to the contact plane defined by the support surface 109.5 the second leaf spring elements 109.16 are arranged such that they define a second tilt axis 109.17 which runs in the tangential direction of the support ring 109.1 and lies within the contact plane defined by the support surface 109.5. The second tilt axis 109.17, along the radial direction (x-axis) is located substantially centrally within the support surface 109.5. The function of this second tilt axis 109.17 will also be explained in further detail below.

It will be appreciated that the size and/or location of the two second leaf spring elements 109.16 may be easily determined in a well-known manner as a function of the desired location of the second tilt axis 109.17, i.e. as a function of the location of the contact plane defined by the support surface 109.5. For example, if both second leaf spring elements 109.16 have the same dimensions and are made of the same material (i.e. have the same bending rigidity), the second tilt axis 109.17 is located halfway between the two second leaf spring elements 109.16.

In case one of the second leaf spring elements has a higher bending rigidity, the location of the second tilt axis is shifted away from the leaf spring element with the higher bending rigidity. Thus, at given geometric boundary conditions for the legs 109.15, by modifying the bending rigidity (e.g. dimensions and/or material) of the respective second leaf spring element 109.16 the location of the second tilt axis 109.17 with respect to the support surface 109.5 may be adjusted.

It will be appreciated that the use of such first leaf spring elements 109.12 and a second leaf spring elements 109.16 has the great advantage that such leaf spring elements compared to spatially confined so-called elastic hinges (i.e. hinge elements at least the length or width dimension of which lies in the order of their thickness dimension) have a considerably greater ability to take extraordinary loads since they have the ability to distribute such loads over their entire length greatly reducing the local stresses acting on the elastic element. Thus, such leaf spring elements are way less failure prone. Furthermore, such leaf spring elements have the ability to at least partially compensate manufacturing inaccuracies and parasitic loads resulting therefrom such that, already by this approach, a reduction of parasitic loads introduced into the optical element 108 may be achieved in a beneficial manner.

Furthermore, in order to be able to adjust the position and/or orientation of the second tilt axis 109.17 with respect to the support surface 109.5 after manufacture of the second lens support element 109.8, an adjustment mechanism (e.g. passive mechanism such as spacers, adjustment screws etc or active mechanism such as piezo-actuators etc) may be provided as it is schematically indicated by the dashed contour 109.18 in FIGS. 4 and 5.

Similar adjustment mechanism may also be provided for the adjustment of the location and/or orientation of the first tilt axis 109.13 with respect to the support surface 109.5 as it is schematically indicated by the dashed contour 109.19 in FIG. 4. Here as well passive mechanism such as spacers, adjustment screws etc or active mechanism such as piezo-actuators may be used.

It will be appreciated that these adjustment mechanisms may not only be used to adjust the location and/or orientation of the respective tilt axis 109.13 and 109.17 with respect to the support surface 109.5. These adjustment mechanisms, at a later stage, may also be used for adjusting the position and/or orientation of the lens 108.

In the exemplary embodiment shown, the respective lower lens contact surface 108.3 is a planar surface which (nominally) runs perpendicular to the optical axis 108.2 of the lens 108 and which is (nominally) coplanar with the other lower lens contact surfaces 108.3. Furthermore, the respective support surface 109.5 is also a planar surface which (nominally) runs perpendicular to an axis 109.6 of rotational symmetry of the support ring 109.2 (which later typically coincides with the optical axis 108.2 of the lens 108 as well as the optical axis 101.1 of the microlithography device 101) and is (nominally) coplanar with the other support surfaces 109.5.

However, it will be appreciated that, with other embodiments of the disclosure, any other arrangement of the lower lens contact surfaces with respect to the optical axis of the lens and any other matching arrangement of the support surfaces with respect to the support ring (or any other suitable support device) may be chosen. Furthermore, it will be appreciated that, with other embodiments of the disclosure, the respective support surfaces and/or the respective lower lens contact surfaces do not necessarily have to be continuous surfaces. Rather either one may be formed by a plurality of separate contact surface sections. For example, the respective support surface may be formed by a plurality of axial protrusions (i.e. protruding in the z-direction), such as pins, ridges or the like forming such a plurality of separate contact surface sections.

In case the lower lens contact surfaces 108.3 and the support surfaces 109.5 have their nominal shape and orientation (i.e. no misalignment exists between the mating surfaces 108.3 and 109.5) while the lens 108 is put down onto the lens holders 109.2 along the z-axis no relative motion between the lower lens contact surfaces 108.3 and the support surfaces 109.5 occurs apart from the motion along the z-axis. Furthermore, the respective support surface 109.5 is (nominally) arranged to be symmetric with respect to be common plane of main extension of the second leaf spring elements 109.16 such that, upon a contact between the mating surfaces 108.3 and 109.5 no tilting moments arise.

Thus, in the ideal or nominal state, over the lower lens contact surfaces 108.3 an even contact pressure prevails which results in the respective resulting support force $F_{Si}$ (acting exclusively in the z-direction) to counteract the gravitational force G. Thus, in this ideal state, no parasitic loads are introduced into the protrusion 108.1 of the lens 108 which might otherwise cause stresses within the lens 108 which may propagate into the optically used area of the lens 108 deteriorating the optical properties of the lens 108 and leading to undesired imaging errors of the optical system.

However, typically, in reality there is some deviation from this ideal nominal shape and orientation of either one of the lower lens contact surfaces 108.3 and the support surfaces 109.5 such that some kind of misalignment exists between the mating surfaces 108.3 and 109.5.

FIGS. 6A to 6D, as an example for such a misalignment, show two configurations where the support surface is inclined with respect to the z-axis (i.e. the axis of the support ring) and the x-axis such that the support surface deviates from its nominal plane NP. More specifically, FIGS. 6A and 6B (in a highly schematic manner) show a lens support 9 as it is known from the prior art such as U.S. Pat. No. 7,154,684 B2 (Shibazaki) mentioned above, while FIGS. 6C and 6D (also in a highly schematic manner) show the lens support 109.3.

Figure 6A:
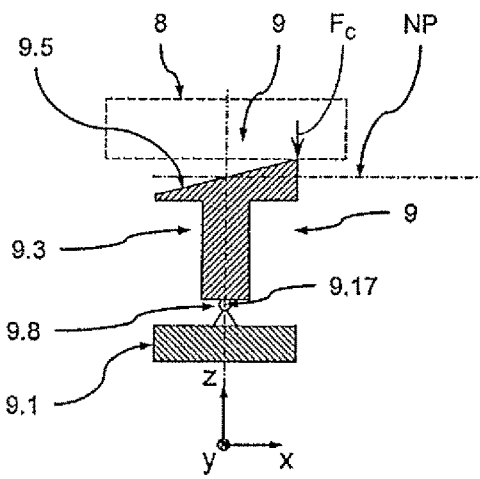
FIG. 6A is a highly schematic representation of a part of a prior art optical element module in a first, unloaded state.
Figure 6B:
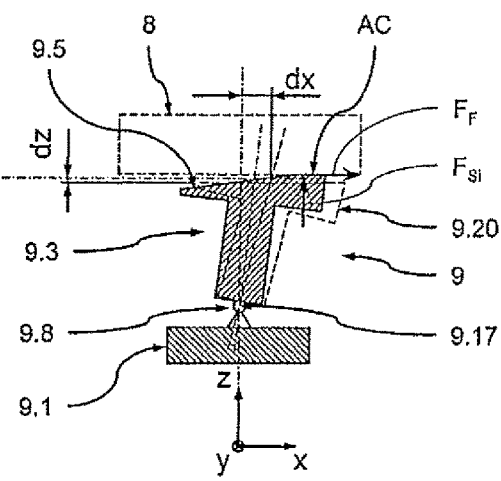
FIG. 6B is a highly schematic representation of the part shown in FIG. 6A in a second, loaded state.
Figure 6C:
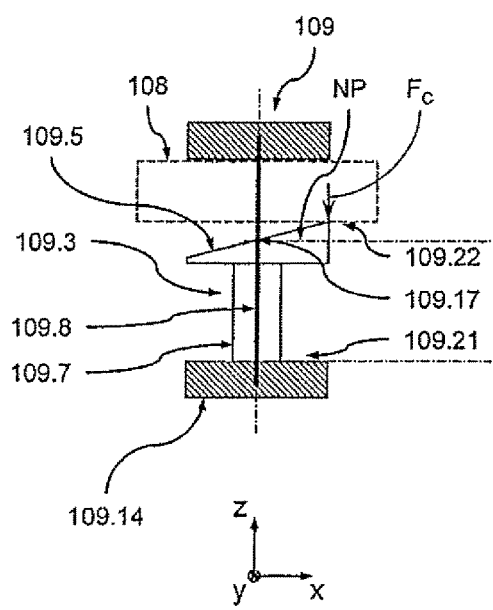
FIG. 6C is a highly schematic representation of the part shown in FIG. 5 in a first, unloaded state.
Figure 6D:
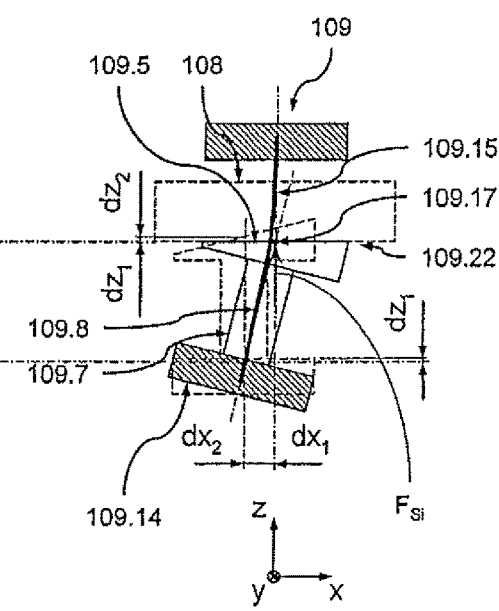
FIG. 6D is a highly schematic representation of the part shown in FIG. 6C in a second, loaded state.

FIGS. 6A and 6C show the respective lens support 9.3 and 109.3 in an unloaded state while FIGS. 6B and 6D show the respective lens support 9.3 and 109.3 in a loaded state where the respective lower lens contact surface 8.3 and 108.3 has achieved its maximum contact with the respective support surface 9.5 and 109.5.

As can be seen from FIGS. 6A and 6B, the previously known lens support 9.3 is connected to the support ring 9.1 via an elastic hinge 9.8 defining a tilt axis 9.17 which runs parallel to the y-axis. The elastic hinge 9.8 is located well below the support surface 9.5 at a distance which is in the order of the length of the support surface 9.5 in the plane of the drawing.

Once the (ideally oriented) lower lens contact surface 8.3 is lowered along the z-axis down onto the support surface 9.5, due to the inclination of the support surface 9.5 (shown highly exaggerated in FIGS. 6A and 6B) with respect to the x-axis and z-axis, a contact force $F_C$ acts on the (rightmost and uppermost) edge of the support surface 9.5 located closest to the lower lens contact surface 8.3. As a consequence, due to lever arm existing between the contact force $F_C$ and the tilt axis 9.17, a bending moment about the y-axis acts on the lens support 9.3 causing the support surface 9.5 to rotate about the tilt axis 9.17 defined by the elastic hinge 9.8.

As can be seen from FIG. 6B, rotation about the tilt axis 9.17 continues until all forces and moment acting in the plane of the drawing mutually balance each other. If there was a frictionless contact between the lower lens contact surface 8.3 and the support surface 9.5 this equilibrium would be reached as soon as the (perfectly planar) lower lens contact surface 8.3 and the support surface 9.5 fully contact as it is indicated by the dashed contour 9.20 in FIG. 6B.

At this point, a considerable relative motion by a distance dx along the x-axis (i.e. parallel to the contact plane) would have taken place between the lower lens contact surface 8.3 and the support surface 9.5. Even under these ideal frictionless conditions, this leads to an uneven distribution of the contact pressure between the le lens contact surface 8.3 and the support surface 9.5 since the line of action of the support force $F_{Si}$ (resulting from this contact pressure distribution) has to intersect the tilt axis 9.17 in order to provide a moment equilibrium. This uneven distribution of the contact pressure may lead to an undesired uneven distribution of the stress introduced into the lens which may even propagate into the optically used area of the lens 8 and lead to undesired imaging errors of the lens 8.

Furthermore, at the point of full contact between the lower lens contact surface 8.3 and the support surface 9.5, the contact plane between the lower lens contact surface 8.3 and the support surface 9.5 would have lowered by a distance dz along the z-axis (i.e. along the support force direction). In case the other two lens supports 8.3 show a different kind and/or degree of misalignment, this may result in an undesired tilting of the optical axis of the lens 8.

Thus, even under these ideal frictionless conditions, undesired load and alignment situations occur with this known lens support 9.3.

However, under real conditions, a frictional contact exists between the lower lens contact surface 8.3 and the support surface 9.5. Typically, the support surface 9.5 is even provided with a friction enhancing coating (e.g. a gold coating). Thus, while putting the lens 8 down onto the lens support 9.3, due to the considerable relative motion between the lower lens contact surface 8.3 and the support surface 9.5, a considerable frictional force $F_F$ acts along the radial direction (i.e. tangential to the plane of the lower lens contact surface 8.3) on the lower lens contact surface 8.3.

This frictional force $F_F$ (typically in combination with an elastic deformation of at least one of the contact partners) may lead to a situation where a force and momentum equilibrium is reached prior to the state where the lower lens contact surface 8.3 and the support surface 9.5 fully contact as it is shown in FIG. 6B. In this typical case, on the one hand, a reduced contact area $A_c$ exists between the lower lens contact surface 8.3 and the support surface 9.5. At a given support force $F_{Si}$ to be provided this leads to an increased contact pressure (with respect to the ideal state) at the lower lens contact surface 8.3 and, consequently, to an increased local normal stress within the lens material. Furthermore, the state with a frictional force $F_F$ acting in the plane of the lower lens contact surface 8.3 typically is frozen leading to an eventually considerable parasitic shear stress introduced into the lens material.

Thus, with the known lens support 9.3, a non-favorable load situation arises with considerable parasitic loads being introduced into the lens material. The stress resulting from these parasitic loads may propagate into the optically used area of the lens 8 leading to undesired imaging errors of the lens 8 and, consequently, the optical system including the lens 8.

On the contrary, as will be explained in the following, with the present disclosure these disadvantages may be largely avoided. As can be seen from FIG. 6C, 6D and as it has been explained above, the legs 109.15 (represented in a simplified manner as a single leaf spring) define a second tilt axis 109.17 which is located substantially within the contact plane defined by the support surface 109.5.

Once the (ideally oriented) lower lens contact surface 108.3 is lowered along the z-axis down onto the support surface 109.5, due to the inclination of the support surface 109.5 (shown highly exaggerated in FIGS. 6C and 6D) with respect to the x-axis and z-axis, a contact force $F_C$ acts along the z-axis on the (rightmost and uppermost) edge of the support surface 109.5 located closest to the lower lens contact surface 108.3. As a consequence, due to lever arm existing between the contact force $F_C$ and the second tilt axis 109.17, a bending moment about the y-axis acts on the lens support 109.3 causing the support surface 109.5 to rotate about the second tilt axis 109.17 defined by the legs 109.15 of the second lens support element 109.8.

For the legs 109.15 (shown as single leaf springs) The contact force $F_c$ in the z-direction results in a force in the z-direction and a bending moment about the y-axis, which is constant along the length of the leaf spring, because the force $F_c$ and the plane of the leaf spring 109.15 are parallel to the z-direction.

The distance from a bent leaf spring end to his center of rotation is given by the ratio of his motion $dx_1$ perpendicular to the leaf spring plane and his bending angle $d_1$. For a constant bending moment $M_b$ along the length L it is:

$$\frac{dx_1}{d\alpha_1} = -\frac{\frac{L^2 \cdot M_b}{2 \cdot E \cdot I_y}}{\frac{L^2 \cdot M_b}{E \cdot I_y}} = -\frac{L}{2} \quad (1)$$

The center of rotation is situated at half the length (L/2) from the bent leaf spring end in the middle of the leaf spring 109.15, such that the second tilt axis 109.17 is situated near to the support surface 109.5, in cases where the plane of the support surface 109.5 intersects the leaf spring 109.15 in the middle of the leaf spring 109.15 (or, if the respective leg is formed by two identical leaf spring sections, for example, in the middle between these two identical leaf spring sections).

As can be seen from FIG. 6D, rotation about the second tilt axis 109.17 continues until all forces and moments acting in the plane of the drawing mutually balance each other. More specifically, in response to this bending moment (resulting from the contact force $F_C$) the first lens support element 109.7 and the legs 109.15 of the second lens support element 109.8 both undergo a certain deflection in a plane of deflection perpendicular to the second tilt axis 109.17 (i.e. the plane of the drawing).

First of all, the legs 109.15 of the second lens support element 109.8 (thanks to a gap existing between them and the support ring 109.1) are bent since they are relatively compliant in this plane of deflection. Thus, the location where the end 109.21 of the first lens support element 109.7 is connected to the base element 109.14 of the second lens support element 109.8 is, both, shifted radially outward (along the x-axis) by a first radial distance $dx_1$ and shifted axially upward (along the z-axis) by a first axial distance $dz_1$. As a consequence, the other end 109.22 of the first lens support element 109.7 located adjacent to the support surface 109.5 also experiences in this radial shift by the first radial distance $dx_1$ and this axial shift (along the z-axis) by the first axial distance $dz_1$.

Furthermore, since the contact element 109.7 is substantially rigid in this plane of deflection, the first lens support element 109.7 also experiences a rotation in this plane of deflection about its end 109.21. Due to this rotation the end 109.22 of the first lens support element 109.7 located adjacent to the support surface 109.5 is, both, shifted radially inward (along the x-axis) by a second radial distance $dx_2$ and shifted axially downward (along the z-axis) by a second axial distance $dz_2$.

In the exemplary embodiment shown, the first radial distance $dx_1$ equals the second radial distance $dx_2$ and the first axial distance $dz_1$ equals the second radial distance $dx_2$. Thus, thanks to the location of the second tilt axis 109.17 substantially within the plane of the contact surface 109.5, the excursion of the end 109.22 of the first lens support element 109.7 along the z-axis (holding force direction) and along the x-axis (radial direction) resulting from its rotation is opposite to the excursion of the end 109.22 of the first lens support element 109.7 end along the z-axis (holding force direction) and along the x-axis (radial direction) resulting from the deflection of the second lens support element 109.8. Thus, substantially no relative (translational motion between the lower lens contact surface 108.3 and the support surface 109.5 in the contact plane occurs.

Consequently, even under real conditions with friction between the lower lens contact surface 108.3 and the support surface 109.5, the lens 108 experiences substantially no frictional forces acting in the contact plane and, thus, undergoes substantially no shear stress (due to parasitic loads) which might propagate into the optically used area of the lens 108 and might cause imaging errors.

In other words, the location of the second tilt axis 109.17 matches the motion of the support surface 109.5 in response to a (theoretical) frictionless contact to the actual motion resulting from the (real) frictional contact. Such a deviation between the theoretical motion and the actual motion otherwise would have to be compensated by an elastic deformation of at least one of the lens 108 and the lens support 109.3 and would lead to a prestress within the respective contact partner and, thus, to a parasitic load introduced into the lens 108.

Furthermore, since the location of the second tilt axis 109.17 remains substantially the same throughout the motion of the lens support 109.3, and, consequently, is located centrally within the support surface 109.5 (along the radial direction), a substantially even distribution of the contact pressure between the lens contact surface 108.3 and the support surface 109.5 is achieved, since the line of action of the support force $F_{Si}$ (resulting from this contact pressure distribution) has to intersect the second tilt axis 109.17 in order to provide a moment equilibrium. This even distribution of the contact pressure avoids an undesired uneven distribution of the stress introduced into the lens which otherwise might even propagate into the optically used area of the lens 108 and lead to undesired imaging errors of the lens 108.

Furthermore, at the point of full contact between the lower lens contact surface 108.3 and the support surface 109.5, the position of the contact plane between the lower lens contact surface 108.3 and the support surface 109.5 will have remained substantially the same along the z-axis (i.e. along the support force direction). Thus, substantially no undesired tilting of the optical axis of the lens 108 occurs.

It will be appreciated that, with other embodiments of the disclosure, the second tilt axis defined by the second lens support element may also have a certain distance from the contact plane defined by the support surface. In this case, a certain relative motion may occur and a certain frictional force may act in this contact plane leading to shear stresses introduced into the lens. However, in order to keep these relative motions and the shear stresses resulting therefrom as low as possible, the distance between the second tilt axis and the contact plane can be less than 20% (e.g., less than 5%, less than 2%) of the maximum length of the contact area between the contact partners in the plane perpendicular to the second tilt axis.

It will be further appreciated that the first tilt axis 109.13 defined by the two first leaf spring elements 109.12 thanks to its location substantially within the plane of the support surface 109.5 (in the plane tangential to the circumferential direction of the support ring in 109.1) has the same effect to compensate for misalignments between the lower lens contact surface 108.3 and the support surface 109.5 and to at least reduce parasitic loads introduced via the support structure 109 into the lens 108.

The first lens support element 109.7 and the second lens support element 109.8 may be formed as monolithic components. However, with other embodiments of the disclosure, either one of the first lens support element and the second lens support element may be formed of a plurality of separate components connected in a suitable manner. In particular, this may be the case if there is a possibility to adjust the location and/or orientation of the first and second tilt axis as outlined above.

Figure 7:
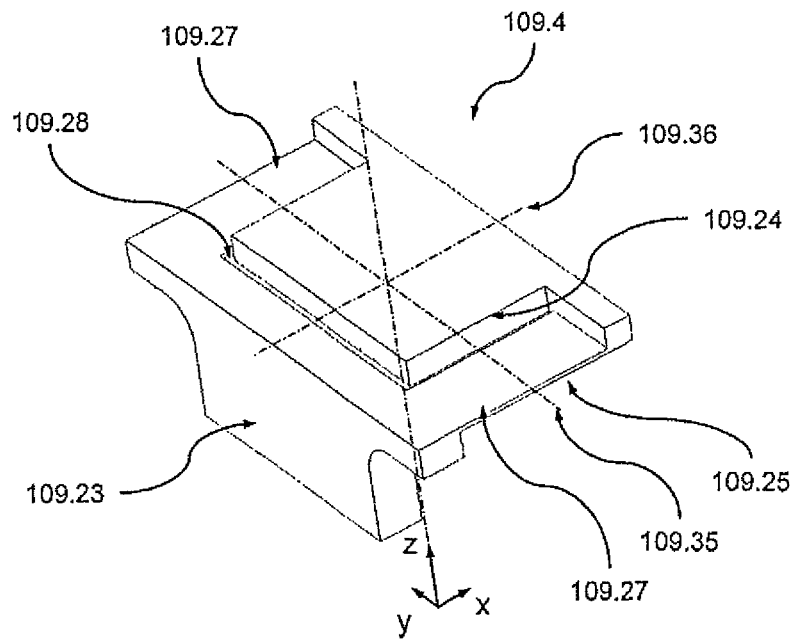
FIG. 7 is an enlarged schematic perspective top view of a clamping element of FIG. 3 (detail VII of FIG. 3).

In the following, with reference to FIGS. 7 and 8, the clamp 109.4 and its functionality or explained in further detail. FIG. 7 is a perspective view of the clamp 109.4 while FIG. 8 is a sectional view along line VIII-VIII of FIG. 2.

The clamp 109.4, in the exemplary embodiment shown, is a monolithic component including a mounting element 109.23, a contact element 109.24 and a linking element 109.25 connecting the mounting element 109.23 and the contact element 109.24. However, it will be appreciated that, with the other embodiments of the disclosure, the clamp may also be formed by a separate components connected to each other in a suitable manner.

As may be seen from FIG. 8, the clamp 109.4 provides a further first contact surface in the form of a clamp surface 109.26 used to exert a further holding force in the form of a clamping force $F_{CL}$ along a clamping force direction (i.e. a first direction along the z-axis) onto an upper lens contact surface 108.4 of the respective protrusion 108.1 of the lens 108.

To this end, (once the lens 108 has been placed onto the lens support 109.3 as it has been described above) the respective clamp 109.4 is aligned with respect to the lens 108 such that the clamp surface 109.26 is arranged substantially parallel to the upper lens contact surface 108.4. Then, the clamp 109.4 is lowered along the axis 109.6 of the support ring 109.1 and the optical axis 108.2 of the lens 108, respectively, (i.e. along the z-axis) down onto the respective lens support 109.3 until the clamping surface 109.26 contacts in the other lens contact surface 108.4 and a mounting surface of the mounting element 109.23 contacts an assigned mounting surface of the lens support 109.3. To achieve this without altering the alignment between the clamp surface 109.26 and the upper lens contact surface 108.4 a suitable guide mechanism (not shown) may be used.

In the exemplary embodiment shown, the respective upper lens contact surface 108.4 is a planar surface which (nominally) runs perpendicular to the optical axis 108.2 of the lens 108 and which is (nominally) coplanar with the other upper lens contact surfaces 108.4. Furthermore, the respective clamp surface 109.26 is also a planar surface which (in a mounted state without clamping a lens nominally) runs perpendicular to an axis 109.6 of rotational symmetry of the support ring 109.2 and is (in the mounted state without clamping a lens nominally) coplanar with the other clamp surfaces 109.26.

However, it will be appreciated that, with other embodiments of the disclosure, any other arrangement of the upper lens contact surfaces with respect to the optical axis of the lens and any other matching arrangement of the clamp surfaces with respect to the support ring (or any other suitable support device) may be chosen. Furthermore, it will be appreciated that, with other embodiments of the disclosure, the respective clamp surfaces and/or the respective upper lens contact surfaces do not necessarily have to be continuous surfaces. Rather either one may be formed by a plurality of separate contact surface sections. For example, the respective clamp surface may be formed by a plurality of axial protrusions (i.e. protruding in the z-direction), such as pins, ridges or the like forming such a plurality of separate contact surface sections.

In the mounted state the protrusion 108.1 and the clamp 109.4 define a mutual contact area AC which has a length Lx along the radial direction (second direction, x-axis) as well as a length Ly along the direction tangential to the circumference of the support ring 109.1 (third direction, y-axis). The length Lx and Ly, respectively, is defined by the contact partner having the smaller dimension in the respective direction. In the exemplary embodiment shown, in both cases the upper lens support surface 108.4 defines the respective length lx and ly. However, it will be appreciated that, with other embodiments of the disclosure, one or both of these lengths may also be defined by the clamp.

The contact area AC defines a reference plane RP which is located along the radial direction (second direction, x-axis) at the center of the contact area AC and is arranged transverse (more precisely perpendicular) to the radial direction.

The linking element 109.25 of the clamp 109.4 includes two leaf spring elements 109.27, in the mounted state of the clamp 109.4 extending in the radial second direction (x-axis) of the support ring 109.1 and, thus, transverse to the clamping force direction. The leaf spring elements 109.27, in the tangential third direction (y-axis), are located on both sides of the contact element 109.24 while being spaced from the contact element 109.24 by a small gap 109.28.

In the exemplary embodiment shown, the each of leaf spring elements 109.27 extends on both sides of the reference plane RP, a first end of the respective leaf spring element 109.27 being connected to the mounting element 109.23 on one side of the reference plane RP and a second end of the respective leaf spring element 109.27 being connected to the contact element 109.24 on the other side of the reference plane RP. Thus, the part of the respective leaf spring 109.27 located between the reference plane RP and the contact element 109.24 forms a first linking section 109.29 while the part of the respective leaf spring 109.27 located between the reference plane RP and the mounting element 109.23 forms a second linking section 109.30. Consequently, the first linking section 109.29 and the second linking section 109.30 are arranged kinematically in series between the mounting element 109.23 and the contact element 109.24.

As will be explained in the following, the dimensions of the leaf spring elements 109.27 are selected such that a contact pressure $p_C$ acts at the contact area AC between the upper lens contact surface 108.4 and the clamp surface 109.26 which is substantially constant over the contact area AC. Thus, a clamping force $F_{CL}$ results from this contact pressure $p_C$ which acts within the reference plane RP. As a result of this resulting clamping force $F_{CL}$ a bending moment $M_y$ is acting on the respective leaf spring element 109.27. The bending moment $M_y$ acts about a bending axis running in the tangential direction of the support ring 109.1 (y-axis), i.e. in a bending plane defined by the axial first direction (z-axis) and the radial second direction (x-axis).

The bending moment $M_y$ has a maximum negative value $M_{y1}$ at the first end of the leaf spring element 109.27 (connected to the contact element 109.24), a maximum positive value $M_{y2}$ at the second end of the leaf spring element 109.27 (connected to the mounting element 109.23) and a zero ($M_y$=0) at the reference plane RP (i.e. the respective wing spring element 109.27 has a point of inflection that the reference plane RP).

Figure 9A:
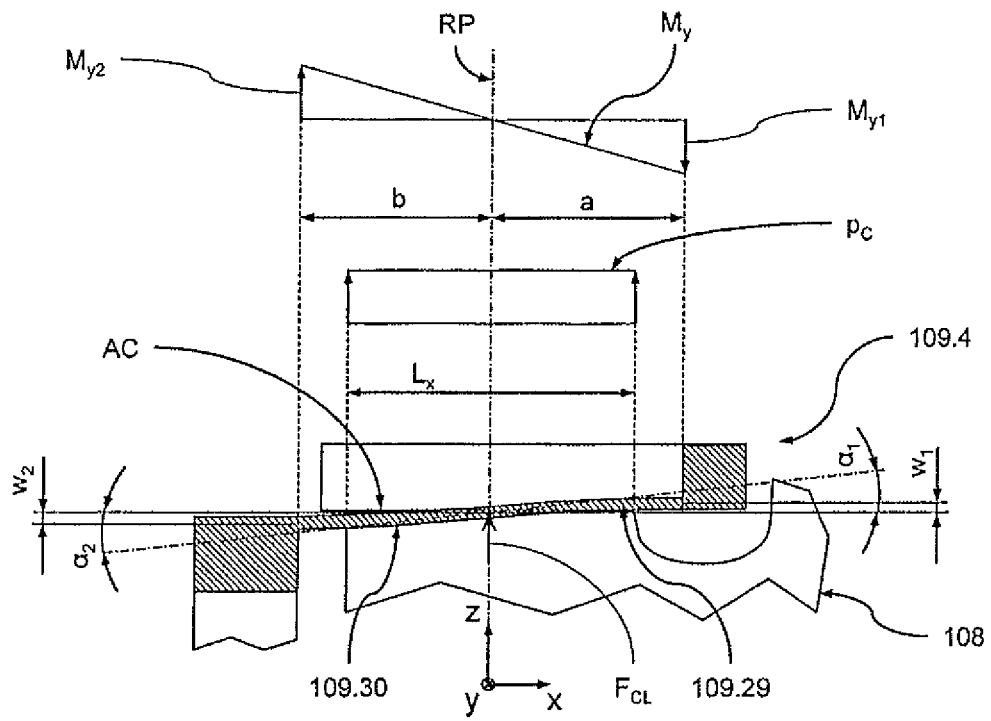
FIG. 9A is a view of the detail IX of FIG. 8.

As can be seen from FIG. 9A, the first linking section 109.29 has a first length a along the radial direction while the second linking section 109.29 has a second length b along the radial direction. Under nominal conditions with a fully planar contact over the contact area AC there is the geometric boundary condition that, both, at the location where the first linking section 109.29 is connected to the contact element 109.24 and at the location where there is second linking section 109.30 is connected to the mounting element 109.23, the angle of the longitudinal axis of the respective leaf spring element 109.27 with respect to the radial direction (x-axis) is zero.

Given this geometric boundary condition, a constant cross-section (i.e. a constant area moment of inertia $I_y$ about the tangential axis or y-axis, respectively) of the respective leaf spring element 109.27 over its entire length along the radial direction each of the two linking sections 109.29 and 109.30 may be considered as a horizontal beam rigidly held on one end and bent due to a vertical force F acting on its free end. Thus, the axial excursion $w_1$, $w_2$ (along the z-axis) of the respective linking section 109.29 and 109.30 at their location of connection calculates as:

$$w_1 = \frac{F \cdot a^3}{3 \cdot E \cdot I_y} \quad (2)$$

and $$w_2 = \frac{F \cdot b^3}{3 \cdot E \cdot I_y}, \quad (3)$$

respectively (at a given elastic modulus E of the material are of the link spring element 109.27). Furthermore, the angle $\alpha_1$, $\alpha_2$ with respect to the radial direction (x-axis) of the respective linking section 109.29 and 109.30 at their location of connection calculates as:

$$\alpha_1 = \frac{F \cdot a^2}{2 \cdot E \cdot I_y} \quad (4)$$

and $$\alpha_2 = \frac{F \cdot b^2}{2 \cdot E \cdot I_y}, \quad (5)$$

respectively. Since, as a further boundary condition, the two angles $\alpha_1$ and $\alpha_2$ have to be the same (i.e. $\alpha_1 = \alpha_2$), it becomes apparent that the first length a and the second length b have to be the same (i.e. a=b).

Figure 9B:
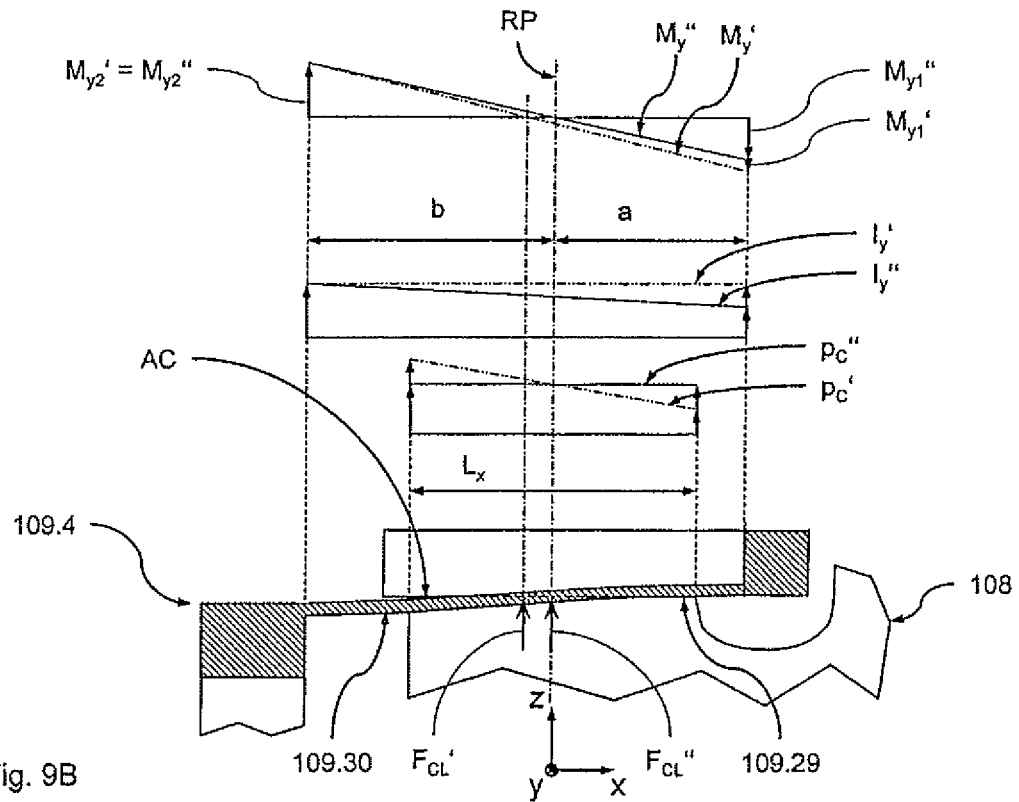
FIG. 9B is a view of the detail IX of FIG. 8 in a modified form.

FIG. 9B illustrates a modification of the clamp 109.4 where the first length a and the second length b of the first and second linking section 109.29 and 109.30 of the respective leaf spring element 109.27 are different (i.e. a≠b, here a<b). As a consequence, if the area moment of inertia $I_y'$ of the leaf spring element 109.27 was kept constant over the length of the leaf spring element 109.27, the zero of the bending moment $M_y'$ and, thus, the location of the resulting clamping force $F_{CL}'$ would be shifted away from the reference plane RP towards the mounting element 109.23. Consequently, an uneven distribution of the contact pressure $p_C$ over the contact area AC would be present. Such an uneven distribution of the contact pressure may be acceptable to a certain degree. Optionally, the deviation within the contact pressure $p_C$ over the contact area AC is less than ±20% (e.g., less than ±10%) of the average contact pressure $p_C$ over the contact area AC.

However, in order to counteract such an uneven contact pressure distribution over the contact area AC the area moment of inertia $I_y''$ of the leaf spring element 109.27 may be modified over the length of the leaf spring element 109.27 such that the zero of the bending moment $M_y''$ and, thus, the clamping force $F_{CL}''$ is shifted back towards (even entirely back to) the reference plane RP. Thus, and even distribution of the contact pressure $p_C$ may be obtained even if the radial length a and b of the respective linking section 109.29 and 109.30 are not the same.

It will be appreciated that, with other embodiments of the disclosure, in addition or as an alternative to modifying the area moment of inertia of the leaf spring elements, also the elastic modulus (i.e. the material) of the leaf spring elements may be modified over their length in order to achieve a substantially evenly distributed contact pressure at the contact area AC.

In other words, the clamp 109.4 according to the disclosure may be easily adapted to various geometric boundary conditions (e.g. a wide variety of the desired length for the leaf spring elements 109.27) in order to provide an even contact pressure $p_C$ over the contact area AC between the upper lens contact surface 108.4 and the clamping surface 109.26. Such an even distribution of the contact pressure $p_C$ over the contact area AC has the great advantage that the risk of locally concentrated stresses which are introduced into the lens 108 and which might even propagate into the optically used area of the lens 108 (and lead to undesired imaging errors of the lens 108 and the optical system including the lens 108) is greatly reduced.

Figure 9C:
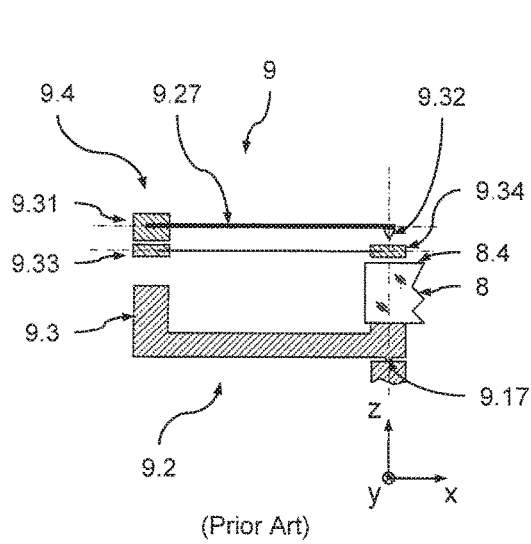
FIG. 9C is a highly schematic representation of a part of a prior art optical element module in a first, unmounted state.
Figure 9D:
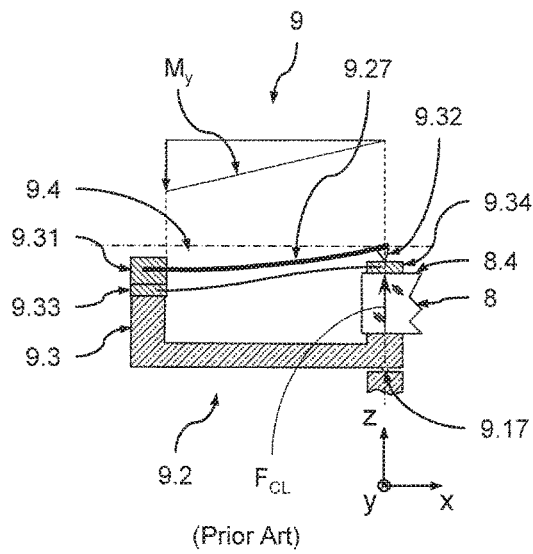
FIG. 9D is a highly schematic representation of the part shown in FIG. 9C in a second, mounted state.
Figure 9E:
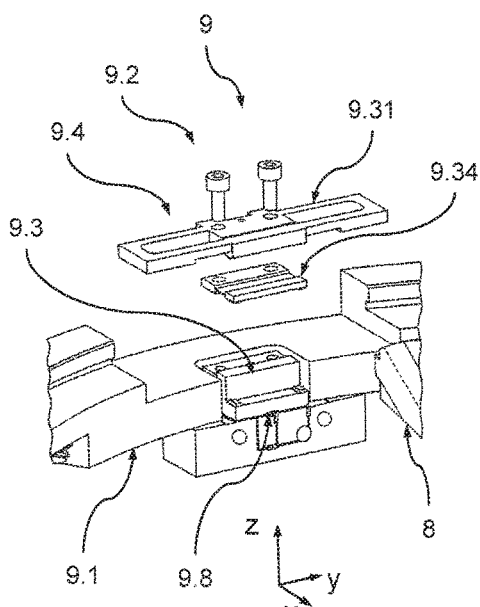
FIG. 9E is a schematic partially sectional and exploded view of a part of the prior art optical element module shown in FIGS. 6A, 6B, 9C and 9D.
Figure 10:
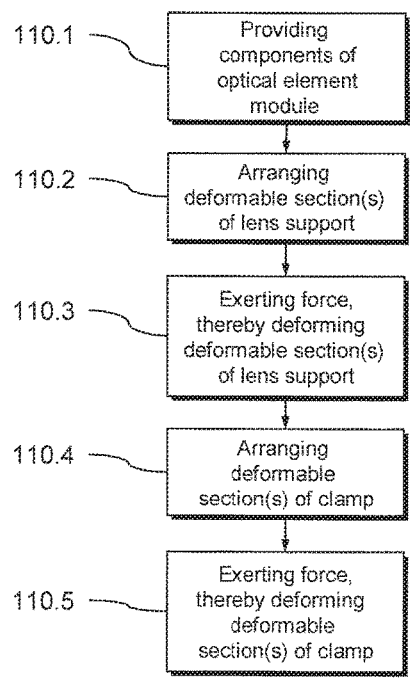
FIG. 10 is a block diagram of an embodiment of a method of exerting a force on a component of the optical element module of FIG. 2.

FIGS. 9C and 9D (in a highly schematic and not to scale manner) show a further part of the lens holder 9.2 (shown in FIGS. 6A and 6B) as it is known from the prior art such as U.S. Pat. No. 7,154,684 B2 (Shibazaki) mentioned above. FIG. 9E is a more detailed representation of this known lens holder 9.2.

FIG. 9C shows the lens holder 9.2 in a state prior to mounting the clamp 9.4 to the lens support 9.3 with the lens 8 supported on the lens support 9.3. FIG. 9D shows in the lens holder 9.2 a state where the clamp 9.4 is mounted to the lens support 9.3 and clamps the lens 8.

As can be seen from FIGS. 9C, 9D and 9E, the previously known clamp 9.4 includes two separate parts, namely a first part 9.31 including a leaf spring element 9.27 with a contact head 9.32 located at its free end (adjacent to the lens 8) and a separate second part 9.33 with a contact element 9.34 arranged between the contact head 9.32 and the upper lens contact surface 8.4 of lens 8.

As can be seen from FIG. 9D, the leaf spring element of 9.27 (in the manner of a beam rigidly held on its end mounted to the lens support 9.3) at its free exerts the clamping force $F_{CL}$ via its contact head 9.32 and the contact element 9.34 onto the upper lens contact surface 9.4. In order to achieve a substantially even distribution of the contact pressure acting at the contact area between contact element 9.34 and the lens 8 the contact head 9.32 has a ridge or roof shaped geometry (providing a line contact to the contact element 9.34) which allows tilting of the contact head 9.32 with respect to the contact element 9.34 (thus avoiding the introduction of a bending moment into the contact area). Consequently, the bending moment $M_y$ acting about the y-axis on the leaf spring element 9.27 has a zero at the location of the contact head 9.32.

The known clamp 9.4, on the one hand, has the disadvantage that it includes separate components introducing a plurality of errors into the system due to manufacturing inaccuracies of these components. Furthermore, the spatially highly concentrated introduction of the clamping force $F_{CL}$ via the very small contact area between the contact head 9.32 and the contact element 9.34 leads to a high stress concentration at this contact area which makes these components prone to failure (e.g. due to loads resulting from accelerations acting on these components).

Contrary to the clamping mechanism of the known support structure 9 the clamp 109.4 according to the disclosure, due to the arrangement of the elastically deformable first and second linking section 109.29 and 109.30 on opposite sides of the reference plane RP, the linking sections 109.29 and 109.30 are adapted to execute matching opposite rotations about the bending axis (y-axis) providing a proper parallel alignment between the clamp surface 109.26 and the upper lens contact surface 108.4. In particular, the first linking section 109.29 at its end connected to the contact element 109.24, as a result of the bending moment $M_y$, executes a rotation about the bending axis (y-axis) which fully compensates the rotation of this end of the first linking section resulting from the rotation about the bending axis (y-axis) resulting from the bending of the second linking section 109.30 in response to the bending moment $M_y$.

Thus, unlike with the previously known clamp 9.4, no such small contact area with a high stress concentration is desirable and, consequently, the risk of failure due to such a high stress concentration is avoided. Rather, extraordinary loads (e.g. resulting from extraordinary accelerations of the mating components) are distributed over the length of the respective leaf spring element 109.27 leading to considerably reduced local stresses within the clamp 109.4.

A further advantage of the clamp 109.4 lies within the fact that the leaf spring elements 109.27 define a further first tilt axis 109.35 and a further second tilt axis 109.36 located substantially within the clamping surface 109.26 and, thus, within the contact area AC (between the clamping surface 109.26 and the upper lens contact surface 108.4). The first tilt axis 109.35 extends along the radial second direction (x-axis) while the second tilt axis 109.36 extends along the tangential third direction (y-axis).

The first tilt axis 109.35 and the second tilt axis 109.36 due to their location within (or at least very close to) the contact area AC, in a manner similar to the tilt axis 109.13 and 109.17, reduce the relative motion between the clamping surface 109.26 and the upper lens contact surface 108.4 parallel to the plane of contact. The detailed functionality of such a tilt axis has been described in detail above in the context of the tilt axis 109.17. Thus, it is here mainly referred to the explanations given above and it shall only to be pointed out once again that, by this approach, frictional shear forces acting between the contact partners and, thus, introduction of parasitic loads into the lens 108 are at least largely avoided which otherwise might propagate into the optically used area of the lens and cause imaging errors.

In order to further reduce any stresses resulting from parasitic loads introduced via the support structure 109 into the respective protrusion 108.1 of the lens 108, the protrusions 108.1 include lower and upper stress relief grooves 108.5 extending in the circumferential direction of the lens 108 adjacent to the lower lens contact surface 108.3 and the upper lens contact surface 108.4. It will be appreciated that, with other embodiments of the disclosure, such as stress relieve grooves may have a different design and, of course, many also be missing on at least one surface of the respective protrusion.

With the optical exposure apparatus 101 of FIG. 1 an exemplary embodiment of a method of holding an optical element unit according to the disclosure may be executed as it will be described in the following with reference to FIGS. 1 through 10.

In a step 110.1, the components of the optical exposure apparatus 101, in particular and the lens 108 and the support structure 109, as they have been described above in the context of FIGS. 1 through 9D are provided.

In a step 110.2 a part of the components of the optical exposure apparatus 101 are put into a spatial relation to provide the configuration as it has been described above in the context of FIGS. 1 through 9D. More specifically, in step 110.2 the deformable linking sections (first lens support element 109.7 and second lens support element 109.8) of the lens support 109.3 are arranged in the manner as it has been described above.

In a step 110.3 the protrusions 108.1 of the lens 108 are placed onto the lens support 109.3 to exert the respective support force $F_{Si}$ on the lens 108 as it has been described above, thereby deforming the deformable linking sections 109.7, 109.8 of the lens support 109.3 in the manner as it has been described above.

In a step 110.4 a further part of the components of the optical exposure apparatus 101 are put into a spatial relation to provide the configuration as it has been described above in the context of FIGS. 1 through 9D. More specifically, in step 110.4 the deformable linking sections (leaf spring elements 109.27) of the clamp 109.4 are arranged in the manner as it has been described above with respect to the lens 108 lens support 109.3.

In a step 110.5 the respective clamp 109.4 is placed onto the respective protrusion 108.1 of the lens 108 and mounted to the lens support 109.3 to exert the respective clamping force $F_{CL}$ on the lens 108 as it has been described above, thereby deforming the deformable linking sections 109.27 of the lens clamp 109.4 in the manner as it has been described above.

Second Exemplary Embodiment

In the following, a second exemplary embodiment of the optical element module 207.1 according to the disclosure will be described with reference to FIGS. 1 through 10 and FIG. 11A. The optical element module 207.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 100 and (unless explicitly described in the following) in respect to these parts reference is made to the explanations given above in the context of the first exemplary embodiment.

Figure 11A:
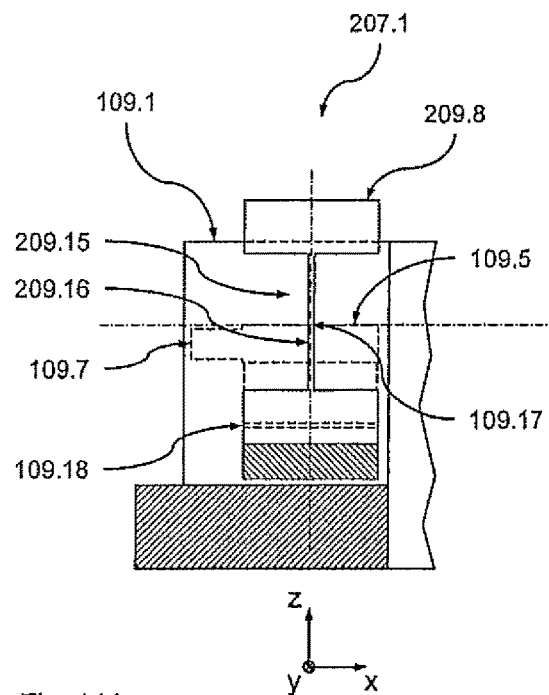
FIG. 11A is a schematic sectional view (similar FIG. 5) of a further embodiment of an optical element module according to the disclosure.

FIG. 11A shows a schematic sectional representation of a detail of the optical element module 207.1 in a view identical to the view of FIG. 5. The only difference of the optical element module 207.1 with respect to the optical element module 107.1 lies within the design of the legs 209.15 of the second lens support element 209.8. Instead of the two leaf spring elements 109.16 there is provided only one single leaf spring element 209.16 per leg 209.15.

The second leaf spring element 209.16 of the respective leg 209.15 has a plane of main extension which is also arranged tangential to the circumferential direction of the support ring 109.1. In relation to the contact plane defined by the support surface 109.5 of the first lens support element 109.7 (indicated by the dashed contour) the second leaf spring element 209.16 is arranged such that it defines the second tilt axis 109.17 as it has been described in detail above in the context of the first exemplary embodiment. In particular, here again, the second tilt axis 109.17 runs in the tangential direction of the support ring 109.1 and lies within the contact plane defined by the support surface 109.5. The second tilt axis 109.17, along the radial direction (x-axis) is located substantially centrally within the support surface 109.5.

It will be appreciated that the size and/or location of the respective second leaf spring element 209.16 may be easily determined in a well-known manner as a function of the desired location of the second tilt axis 109.17, i.e. as a function of the location of the contact plane defined by the support surface 109.5. For example, if the second leaf spring element 209.16 as a constant area moment of inertia $I_y$ about a tangential axis (y-axis), the second tilt axis 109.17 is located centrally along the axial direction (z-axis) between both ends of the second leaf spring element 209.16.

In case the second leaf spring elements has either an area moment of inertia $I_y$ about a tangential axis (y-axis) or an elastic modulus E varying along the axial direction (z-axis), the location of the second tilt axis may be shifted. Thus, at given geometric boundary conditions for the legs 209.15, by modifying the dimensions and/or material properties of the second leaf spring element 209.16, the location of the second tilt axis 109.17 with respect to the support surface 109.5 may be adjusted. Furthermore, adjustment mechanism 109.18 as they have been described above may be used.

It will be appreciated that with this optical element module in 207.1 the method of holding an optical element unit according to the disclosure (as it has been described above in the context of the first exemplary embodiment) may be executed as well.

Third Exemplary Embodiment

In the following, a third exemplary embodiment of the optical element module 307.1 according to the disclosure will be described with reference to FIGS. 1 through 10 and FIG. 11B. The optical element module 307.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 200 and (unless explicitly described in the following) in respect to these parts reference is made to the explanations given above in the context of the first exemplary embodiment.

Figure 11B:
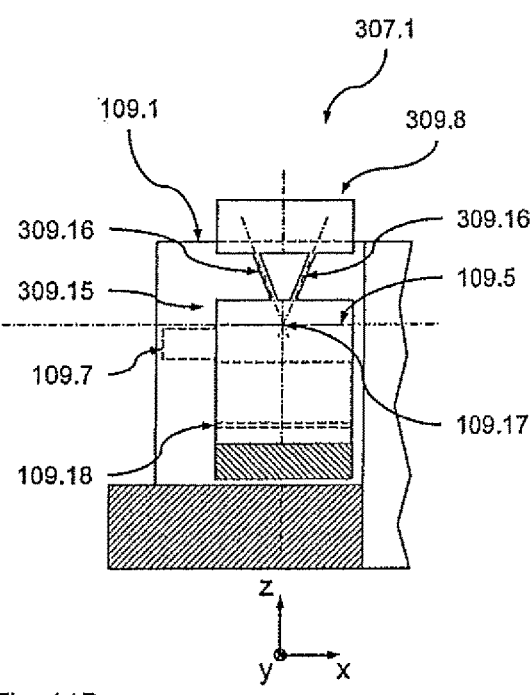
FIG. 11B is a schematic sectional view (similar FIG. 5) of a further embodiment of an optical element module according to the disclosure.

FIG. 11B shows a schematic sectional representation of a detail of the optical element module 307.1 in a view identical to the view of FIG. 5. The only difference of the optical element module 307.1 with respect to the optical element module 107.1 lies within the design of the legs 309.15 of the second lens support element 309.8. Instead of the two coplanar leaf spring elements 109.16 there are provided two second leaf spring elements 309.16 the planes of main extension of which intersect at a line of intersection defining the second tilt axis 109.17 and running in the tangential direction of the support ring 109.1 (y-axis).

Again, the second tilt axis 109.17 lies within the contact plane (for the lower lens contact surface 108.3) defined by the support surface 109.5 of the first lens support element 109.7 (indicated by the dashed contour). The function of this second tilt axis 109.17 has been described in detail above in the context of the first exemplary embodiment. In particular, here again, the, along the radial direction (x-axis) is located substantially centrally within the support surface 109.5.

It will be appreciated that, at given geometric boundary conditions for the legs 109.15, by modifying the position of a line of intersection of the planes of main extension of the second leaf spring elements 309.16, the location of the second tilt axis 109.17 with respect to the support surface 109.5 may be adjusted. Furthermore, adjustment mechanism 109.18 as they have been described above may be used.

It will be further appreciated that, the second leaf spring elements may also be arranged on the opposite side of the contact plane defined by the support surface 109.5. Furthermore, additional second leaf springs may be provided as long as the planes of main extension substantially intersect at a common line of intersection defining the second tilt axis 109.17.

It will be further appreciated that with this optical element module in 307.1 the method of holding an optical element unit according to the disclosure (as it has been described above in the context of the first exemplary embodiment) may be executed as well.

Fourth Exemplary Embodiment

In the following, a fourth exemplary embodiment of the optical element module 407.1 according to the disclosure will be described with reference to FIGS. 1 through 10 and FIG. 11C. The optical element module 407.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 300 and (unless explicitly described in the following) in respect to these parts reference is made to the explanations given above in the context of the first exemplary embodiment.

Figure 11C:
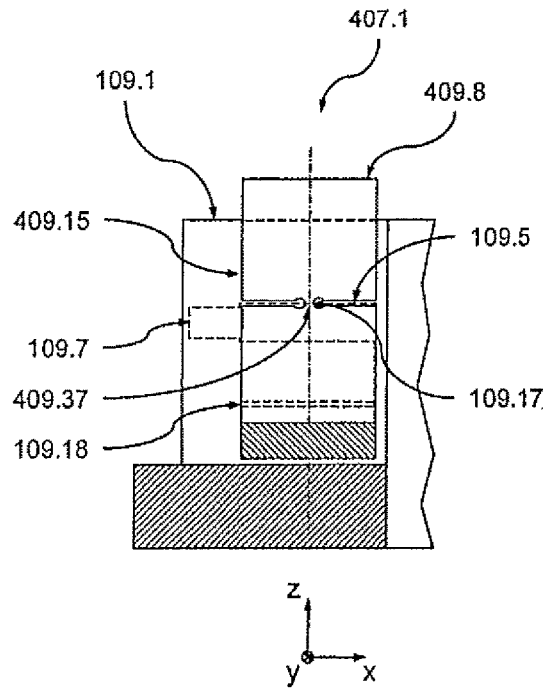
FIG. 11C is a schematic sectional view (similar to FIG. 5) of a further embodiment of an optical element module according to the disclosure.

FIG. 11C shows a schematic sectional representation of a detail of the optical element module 407.1 in a view identical to the view of FIG. 5. The only difference of the optical element module 407.1 with respect to the optical element module 107.1 lies within the design of the legs 409.15 of the second lens support element 409.8. Instead of the two coplanar leaf spring elements 109.16 there is provided one single elastic hinge element 409.37 defining the second tilt axis 109.17 again running in the tangential direction of the support ring 109.1 (y-axis).

Again, the second tilt axis 109.17 lies within the contact plane (for the lower lens contact surface 108.3) defined by the support surface 109.5 of the first lens support element 109.7 (indicated by the dashed contour). The function of this second tilt axis 109.17 has been described in detail above in the context of the first exemplary embodiment. In particular, here again, the, along the radial direction (x-axis) is located substantially centrally within the support surface 109.5.

It will be appreciated that, at given geometric boundary conditions for the legs 109.15, by modifying the position of the elastic hinge element 409.37, the location of the second tilt axis 109.17 with respect to the support surface 109.5 may be adjusted. Furthermore, adjustment mechanism 109.18 as they have been described above may be used.

It will be further appreciated that, in a manner similar to the first exemplary embodiment two or more such elastic hinge elements may be provided (along the axial direction) which then, in combination, define the location of the second tilt axis 109.17.

It will be further appreciated that with this optical element module in 407.1 the method of holding an optical element unit according to the disclosure (as it has been described above in the context of the first exemplary embodiment) may be executed as well.

Fifth Exemplary Embodiment

In the following, a fifth exemplary embodiment of the optical element module 507.1 according to the disclosure will be described with reference to FIGS. 1 through 10 and FIG. 12. The optical element module 507.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 400 and (unless explicitly described in the following) in respect to these parts reference is made to the explanations given above in the context of the first exemplary embodiment.

Figure 12:
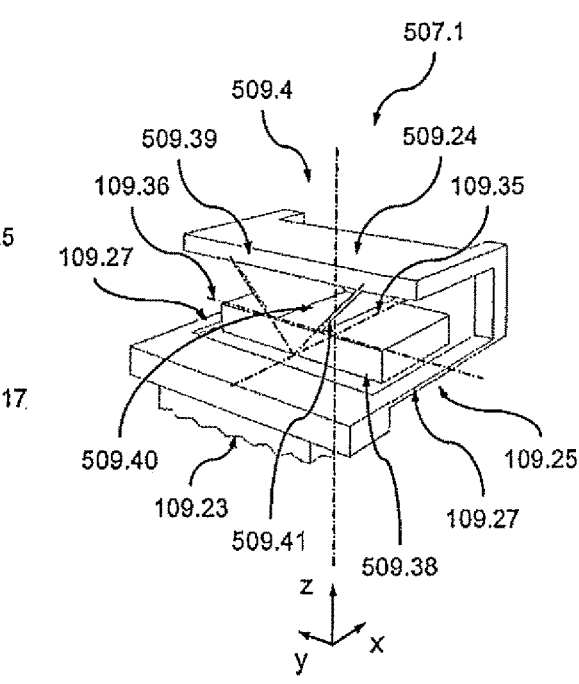
FIG. 12 is a schematic perspective view (similar to FIG. 7) of a clamp of a further embodiment of an optical element module according to the disclosure.

FIG. 12 shows a schematic sectional representation of a detail of the optical element module 507.1 in a view similar to the view of FIG. 7. The only difference of the optical element module 507.1 with respect to the optical element module 107.1 lies within the design of the contact element 509.24 of the clamp 509.4.

While the mounting element 109.23 and the linking element 109.25 (with the leaf spring elements 109.27) of the clamp 509.4 are identical to the ones that have been described above in the context of the first exemplary embodiment, the contact element 509.24, at a first end, has a first contact element part 509.38 providing the clamp surface 109.26 (as it has been described above in the context of the first exemplary embodiment). At a second end, the contact element 509.24 has a second contact element part 509.39 which, on the one hand, is connected to the two leaf spring elements 109.27 of the linking element 109.25 and, on the other hand, is connected to the first contact element part 509.38 via a connecting part 509.40.

The connecting part 509.40 of the contact element 509.24 is formed by two leaf spring elements 509.41 which are arranged such that their planes of main extension intersect at a line of intersection which runs in the radial direction (x-axis) of the support ring 109.1 and lies within the contact plane (for the upper lens contact surface 108.4) defined by the clamping surface 109.26. This line of intersection of the two leaf spring elements 509.41 defines the first tilt axis 109.36 of the clamping surface 109.26.

In comparison to the clamp 109.4 of the first exemplary embodiment the clamp 509.4 has the advantage that the tilting movement of the clamping surface 109.26 about the first tilt axis 109.36 has not to be provided by a torsion of the leaf spring elements 109.27 (which also have to provide the clamping force $F_{CL}$) but is provided by a bending of the leaf spring elements 509.41. Thus, it is possible to provide a configuration with less resistance against such a tilting movement.

Here as well, the first tilt axis 109.36 lies within the contact plane (for the upper lens contact surface 108.4) defined by the clamp surface 109.26 of the clamp 509.4 (indicated by the dashed contour). The function of this first tilt axis 109.36 has been described in detail above in the context of the first exemplary embodiment. In particular, here again, the first tilt axis 109.36, along the tangential direction (y-axis), is located substantially centrally within the clamp surface 109.26.

It will be further appreciated that additional leaf spring elements may be provided as long as the planes of main extension substantially intersect at a common line of intersection defining the first tilt axis 109.36.

It will be further appreciated that with this optical element module in 507.1 the method of holding an optical element unit according to the disclosure (as it has been described above in the context of the first exemplary embodiment) may be executed as well.

Sixth Exemplary Embodiment

In the following, a sixth exemplary embodiment of the optical element module 607.1 according to the disclosure will be described with reference to FIGS. 1 through 10, FIGS. 13 and 14. The optical element module 607.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 500 and (unless explicitly described in the following) in respect to these parts reference is made to the explanations given above in the context of the first exemplary embodiment.

Figure 13:
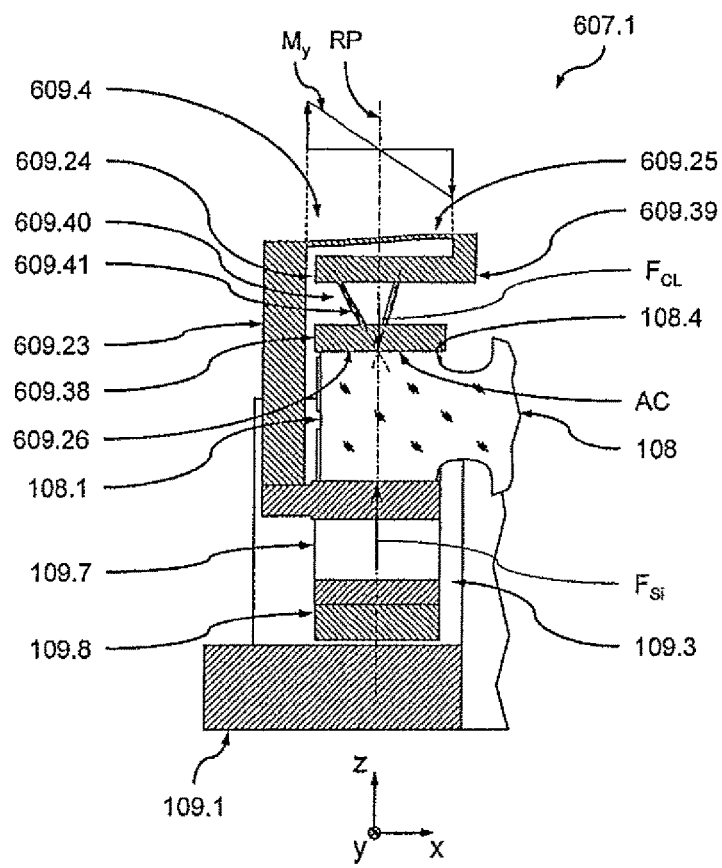
FIG. 13 is a schematic sectional view (along line XIII-XIII of FIG. 2) of a further embodiment of an optical element module according to the disclosure.
Figure 14:
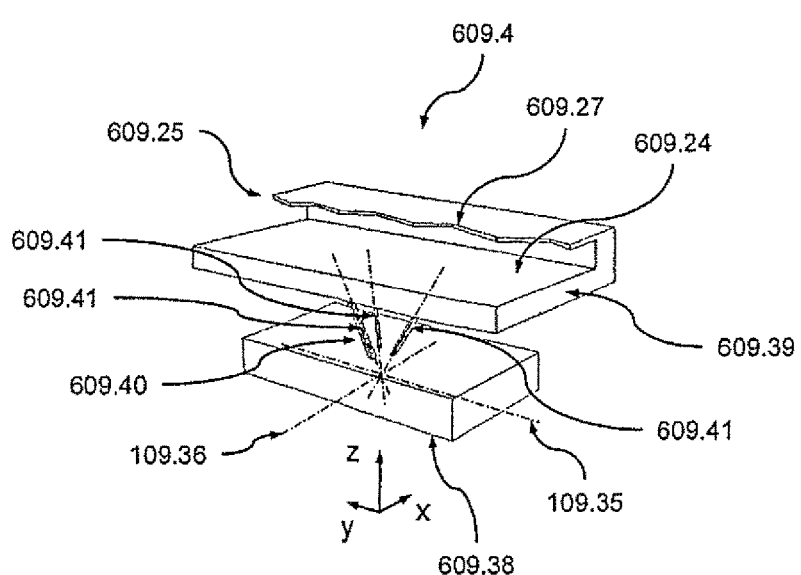
FIG. 14 is a schematic sectional perspective view (similar to FIG. 7) of the clamping element of the optical element module of FIG. 13.

FIG. 13 shows a schematic sectional representation of a part of the optical element module 607.1 in a section similar to the section along line XIII-XIII of FIG. 2 while FIG. 14 is a schematic perspective view of a part of the clamp 609.4 of FIG. 13. The only differences of the optical element module 607.1 with respect to the optical element module 107.1 lie within the design of the clamp 609.4.

One difference to the clamp 109.4 lies within the fact that the linking element 609.25 (linking the mounting element 609.23 and the contact element 609.24) includes one single leaf spring element 609.27 located above the contact element 609.24 (instead of two separate leaf spring elements 109.27 located on opposite sides of the contact element 109.24). However, the arrangement of the leaf spring element 609.27 with respect to the reference plane RP is identical to the one of the leaf spring elements 109.27 described above in the context of the first exemplary embodiment. Thus, it is here only referred to the explanations given above for the leaf spring elements 109.27 and it is only to be noted that, here as well, an even distribution of the contact pressure $p_C$ is obtained over the contact area AC between the clamp surface 109.26 and the upper lens contact surface 108.4 (leading to a clamping force $F_{CL}$ located within the reference plane RP).

A second difference to the clamp 109.4 lies within the fact that the contact element 609.24, at a first end, has a first contact element part 609.38 providing the clamp surface 109.26 (as it has been described above in the context of the first exemplary embodiment). At a second end, the contact element 609.24 has a second contact element part 609.39 which, on the one hand, is connected to the leaf spring element 609.27 of the linking element 609.25 and, on the other hand, is connected to the first contact element part 609.38 via a connecting part 609.40.

The connecting part 609.40 of the contact element 609.24 is formed by three elastically deformable strut elements 609.41 which are arranged in the manner of a tripod such that their longitudinal axes intersect at a point of intersection which lies within the contact plane (for the upper lens contact surface 108.4) defined by the clamping surface 109.26. This point of intersection of the axes of the three strut elements 609.41 defines a tilt point which, in turn, defines (among others) the tilt axes 109.35 and 109.36 of the clamping surface 109.26 as they have been described above.

In comparison to the clamp 109.4 of the first exemplary embodiment the clamp 609.4 has the advantage that any tilting movement of the clamping surface 109.26 has not to be provided by a torsion or bending of the leaf spring element 609.27 (which also has to provide the clamping force $F_{CL}$) but is provided by a bending of the strut elements 609.41. Thus, it is possible to provide a configuration with less resistance against such a tilting movement.

Here as well, the respective tilt axis 109.35 and 109.36 lies within the contact plane (for the upper lens contact surface 108.4) defined by the clamp surface 109.26 of the clamp 609.4. The function of the respective tilt axis 109.36 has been described in detail above in the context of the first exemplary embodiment. In particular, here again, the respective tilt axis 109.35 and 109.36, along the tangential direction (y-axis) and the radial direction (x-axis), respectively, is located substantially centrally within the clamp surface 109.26.

It will be further appreciated that additional elastic strut elements may be provided as long as the longitudinal axes substantially intersect at a common point of intersection defining the respective tilt axis 109.35 and 109.36.

It will be further appreciated that with this optical element module in 607.1 the method of holding an optical element unit according to the disclosure (as it has been described above in the context of the first exemplary embodiment) may be executed as well.

Seventh Exemplary Embodiment

In the following, a seventh exemplary embodiment of the optical element module 707.1 according to the disclosure will be described with reference to FIGS. 1 through 10 and FIG. 13 through 15. The optical element module 707.1 in its basic design and functionality largely corresponds to the optical element module 107.1 as well as 607.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 600 and (unless explicitly described in the following) in respect to these parts reference is made to the explanations given above in the context of the first exemplary embodiment.

Figure 15:
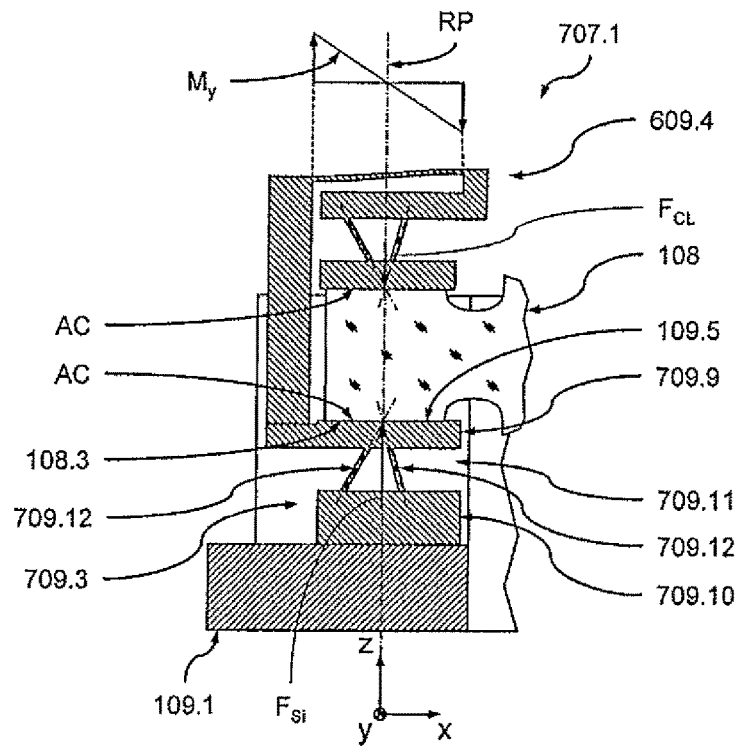
FIG. 15 is a schematic sectional view (similar to FIG. 13) of a further embodiment of an optical element module according to the disclosure.

FIG. 15 shows a schematic sectional representation of a part of the optical element module 707.1 in a section similar to the section of FIG. 13. One difference of the optical element module 707.1 with respect to the optical element module 607.1 lies within the design of the connecting part 709.11 connecting the first contact element part 709.9 (providing the support surface 109.5) and the second contact element part 709.10 of the first lens support element 709.7.

The connecting part 709.11 is designed in a manner similar to the connecting part 609.40 of the clamp 609.4. In particular, the connecting part 709.11 is formed by three elastically deformable strut elements 709.12 which are arranged in the manner of a tripod such that their longitudinal axes intersect at a point of intersection which lies within the contact plane (for the lower lens contact surface 108.3) defined by the support surface 109.5. This point of intersection of the axes of the three strut elements 709.12 defines a tilt point which, in turn, defines (among others) the tilt axes 109.13 and 109.17 of the support surface 109.26 as they have been described above.

Here as well, the respective tilt axis 109.13 and 109.17 lies within the contact plane (for the lower lens contact surface 108.3) defined by the support surface 109.5 lens support 709.3. The function of the respective tilt axis 109.13 and 109.17 has been described in detail above in the context of the first exemplary embodiment. In particular, here again, the respective tilt axis 109.13 and 109.17, along the radial direction (x-axis) and the tangential direction (y-axis), respectively, is located substantially centrally within the support surface 109.5.

In comparison to the lens support 109.3 of the first exemplary embodiment the lens support 709.3 has the advantage that any tilting movement of the support surface 109.5 is provided by a bending of the strut elements 709.12. Thus, it is possible to provide a configuration with few resistance against such a tilting movement and there is no need for further components providing any tilt axis for the support surface 109.5. Consequently, a second difference with respect to the first and sixth exemplary embodiment lies within the fact that the first lens support element 709.7 is supported directly on the support ring 109.1.

It will be further appreciated that additional elastic strut elements may be provided as long as the longitudinal axes substantially intersect at a common point of intersection defining the respective tilt axis 109.13 and 109.17.

It will be further appreciated that with this optical element module in 707.1 the method of holding an optical element unit according to the disclosure (as it has been described above in the context of the first exemplary embodiment) may be executed as well.

Eighth Exemplary Embodiment

In the following, an eighth exemplary embodiment of the optical element module 807.1 according to the disclosure will be described with reference to FIGS. 1 through 10 and FIG. 16. The optical element module 807.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 700 and (unless explicitly described in the following) in respect to these parts reference is made to the explanations given above in the context of the first exemplary embodiment.

Figure 16:
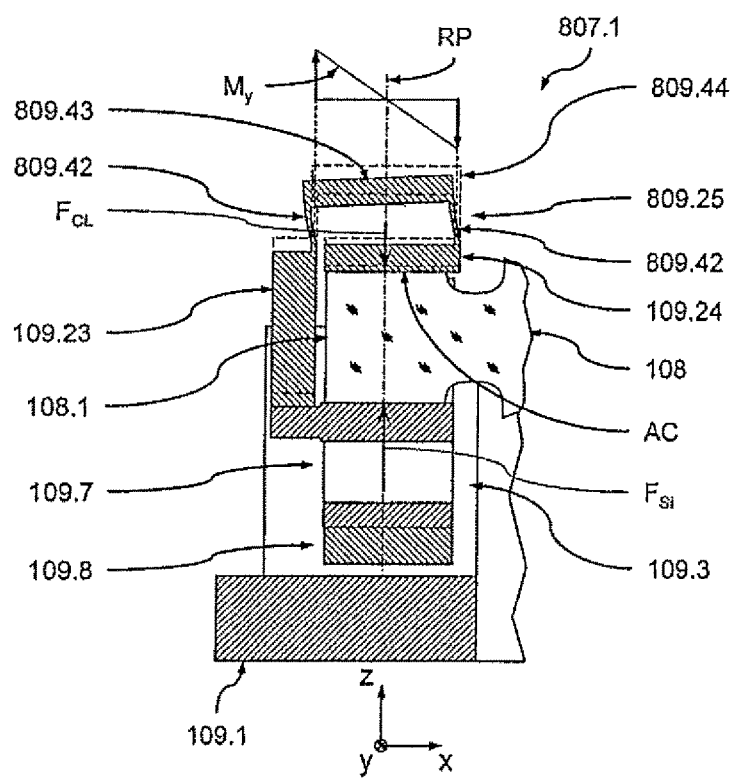
FIG. 16 is a schematic sectional view (similar to FIG. 13) of a further embodiment of an optical element module according to the disclosure.
Figure 17:
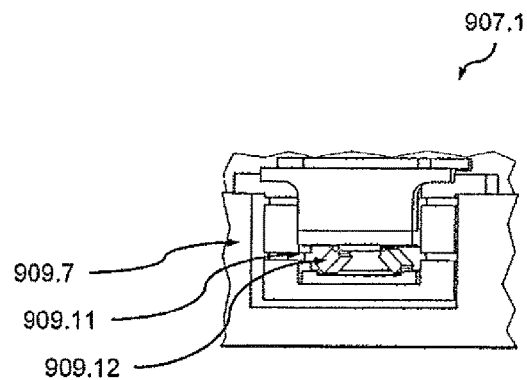
FIG. 17 is a schematic perspective view (similar to FIG. 3) of a further embodiment of an optical element module according to the disclosure.
Figure 18:
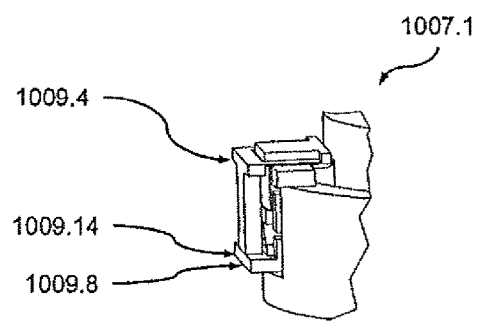
FIG. 18 is a schematic perspective view (similar to FIG. 3) of a further embodiment of an optical element module according to the disclosure.
Figure 19:
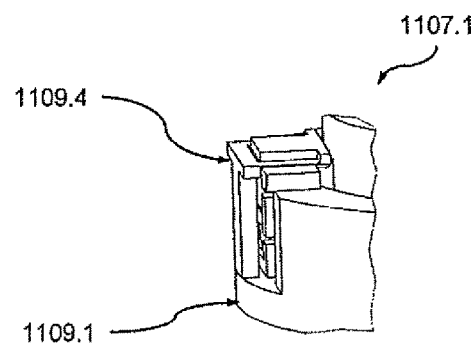
FIG. 19 is a schematic perspective view (similar to FIG. 3) of a further embodiment of an optical element module according to the disclosure.

FIG. 16 shows a schematic sectional representation of a detail of the optical element module 807.1 in a view similar to the view of FIG. 13. The only difference of the optical element module 807.1 with respect to the optical element module 107.1 lies within the design of the linking element 809.25 of the clamp 809.4.

While the mounting element 109.23 and the contact element 109.24 of the clamp 809.4 are identical to the ones that have been described above in the context of the first exemplary embodiment, the linking element 809.25 includes two leaf spring elements 809.42 located on opposite sides of the reference plane RP and being connected by a substantially rigid connecting element 809.43.

As it is indicated by the dashed contour 809.44, the leaf spring elements 809.42 (in an unloaded state of the clamp 809.4) have a plane of main extension extending along the axial direction (z-axis). As may be seen from FIG. 16, thanks to the arrangement of deformable elements on both sides of the reference plane RP, with such a configuration as well, a substantially even distribution of the content pressure $p_C$ acting at the contact area AC may be achieved to such that the resulting clamping force $F_{CL}$ substantially acts within the reference plane RP.

Consequently, it will be appreciated that, according to the disclosure, the elastically deformable sections of the clamp may have any suitable orientation with respect to the radial direction (x-axis). As long as such deformable sections or are located on both sides of the reference plane RP (defined by the content area AC) it is possible to achieve a substantially even distribution of the content pressure $p_C$ acting at the contact area AC in order to reduce load concentrations which might otherwise lead to locally concentrated stresses which might even propagate to the optically used area of the lens 108 (leading to desired imaging errors).

It will be further appreciated that with this optical element module in 807.1 the method of holding an optical element unit according to the disclosure (as it has been described above in the context of the first exemplary embodiment) may be executed as well.

Ninth Exemplary Embodiment

In the following, an ninth exemplary embodiment of the optical element module 907.1 according to the disclosure will be described with reference to FIGS. 1 through 10 and FIG. 17. The optical element module 907.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 800 and (unless explicitly described in the following) in respect to these parts reference is made to the explanations given above in the context of the first exemplary embodiment.

The only difference to the optical element module 107.1 lies within the fact that the connecting part 909.11 of the first lens support element 909.7 is formed by two first leaf spring elements 909.12 which are not formed as continuous leaf springs but as an element having two separate leaf spring sections.

Tenth Exemplary Embodiment

In the following, a tenth exemplary embodiment of the optical element module 1007.1 according to the disclosure will be described with reference to FIGS. 1 through 10 and FIG. 18. The optical element module 1007.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 900 and (unless explicitly described in the following) in respect to these parts reference is made to the explanations given above in the context of the first exemplary embodiment.

The only difference to the optical element module 107.1 lies within the fact that the clamp 1009.4 is mounted directly to the base section 1009.14 of the U-shaped second lens support element 1009.8.

Eleventh Exemplary Embodiment

In the following, an eleventh exemplary embodiment of the optical element module 1107.1 according to the disclosure will be described with reference to FIGS. 1 through 10 and FIG. 19. The optical element module 1107.1 in its basic design and functionality largely corresponds to the optical element module 107.1 and may replace the optical element module 107.1 in the optical imaging device 101 of FIG. 1. Thus, it is here mainly referred to the explanations given above and only the differences with respect to the optical element module 107.1 will be explained in further detail. In particular, similar parts are given the same reference numeral raised by the amount 900 and (unless explicitly described in the following) in respect to these parts reference is made to the explanations given above in the context of the first exemplary embodiment.

The only difference to the optical element module 107.1 lies within the fact that the clamp 1109.4 is mounted directly to the support ring 1109.1.

In the foregoing, the disclosure has been described in the context of embodiments where optical element modules including an optical element and a holder holding the optical element have been used. However, it will be appreciated that the disclosure may also be applied to embodiments where the fluidic actuator is directly connected to the optical element.

Furthermore, the disclosure has predominantly been described in the context of embodiments where the fluidic actuator is used for altering the position (i.e. location and/or orientation in space) of an optical element. However, as already indicated above, it will be appreciated that, with other embodiments of the disclosure, the actuation force provided by the actuator according to the disclosure may also be used for altering the geometry of such an optical element or any other component of an optical device. Furthermore, the actuation force provided by the actuator according to the disclosure may be used for any other task in such an optical device.

In the foregoing, the disclosure has been described solely in the context of examples where the contact elements of the holding device directly act on the optical element being the single component of the optical element unit. However, it will be appreciated that, with other embodiments of the disclosure, the optical element unit (apart from the optical element) may also include further components (such as a holding element or the like directly contacting the optical element) which are contacted by the holding device and transfer the loads introduced into them towards the optical element.

In the foregoing, the disclosure has been described solely in the context of microlithography systems working with exposure light at a wavelength of 193 nm. However, it will be appreciated that the disclosure may also be used in the context of any other optical device working at any other wavelength, in particular, any other optical device using deformation sensitive components. In particular, the disclosure may also be used in the context of so called EUV systems working at a wavelength below 20 nm, typically at about 13 nm.

Finally, it will be appreciated that the disclosure may be used in the context of any type of optical element at any location within an optical device, in particular, in the context of refractive, reflective and diffractive optical elements or any combination thereof.

What is claimed is:

1. An optical element module, comprising:
   an optical element unit comprising an optical element; and
   a support structure comprising a support device and a contact device connected to the support device,
   wherein:
      a surface of the contact device contacts a surface of the optical element unit and exerts a holding force on the optical element unit along a line of action of the holding force;
      the contact device comprises at least one leaf spring element defining first and second linking sections kinematically in series between the surface of the contact device and the support device so that a first end of the first linking section is adjacent to the surface of the contact device and a second end of the first linking section is adjacent to the second linking section;
      the first linking section extends from the first end to the second end along a linking direction running transverse to the line of action of the holding force;
      the second linking section extends along the linking direction;
      the first and second linking sections interface at an interface point located substantially within a reference plane;
      the first and second linking sections are arranged substantially on opposite sides of the reference plane;
      the reference plane comprises the line of action of the holding force;
      the reference plane runs transverse to the linking direction; and
      the first and second linking sections are elastically deformed in response to a contact force introduced into the surface of the contact device along the line of action of the holding force so that the interface point is a point of inflection of the at least one leaf spring element and so that, along the linking direction, one of the first and second linking sections is concave and the other of the first and second linking sections is convex.

2. The optical element module according to claim 1, wherein
   at least one of the first linking section and the second linking section comprises an elastic hinge element;
   the elastic hinge element being elastically deformed in response to the holding force.

3. The optical element module according to claim 1, wherein
   the contact device comprises a contact element and a mounting element connected to the support device;
   the surface of the contact device is a surface of the contact element;
   the contact element, along the linking direction, extending on both sides of the reference plane;
   the contact element extending along a transverse direction, the transverse direction running transverse to the line of action of the holding force and the linking direction,
   the first linking section and the second linking section being formed by two leaf spring elements;
   the leaf spring elements, along the transverse direction, being arranged on opposite sides of the contact element;
   each of the leaf spring elements, at a first end located on one side of the reference plane, being connected to the contact element and, at a second end located on the other side of the reference plane, being connected to the mounting element.

4. The optical element module according to claim 1, wherein
   the first linking section and the second linking section, in response to the holding force, experiencing a bending moment about a bending axis running transverse to a bending plane, the bending plane being defined by the line of action of the holding force and the linking direction;
   the first linking section and the second linking section being arranged such that, along the linking direction, the bending moment changes from a positive value to a negative value at a point of zero bending moment;
   the point of zero bending moment being the point of inflection.

5. The optical element module according to claim 1, wherein
   the surface of the contact device exerts a holding contact pressure on the surface of the optical element;

the first linking section and the second linking section being deformed in such a manner that the holding contact pressure has a substantially even distribution over the surface of the optical element unit.

6. The optical element module according to claim 1, wherein the contact device is a monolithic component.

7. The optical element module according to claim 1, wherein
the contact device is arranged to define a tilt axis of a tilt motion of the surface of the contact device, the tilt motion resulting from a contact force introduced into the surface of the contact device along the line of action of the holding force;
the tilt axis being at least one of located close to the surface of the contact device and located substantially within the surface of the contact device.

8. The optical element module according to claim 7, wherein
the surface of the contact device defines a contact plane for the surface of the optical element unit and a maximum contact surface length dimension in the contact plane in a direction transverse to the tilt axis;
a distance between the surface of the contact device and the tilt axis being at least one of less than 20% of the maximum contact surface length dimension and less than 5% of the maximum contact surface length dimension.

9. The optical element module according to claim 7, wherein the tilt axis is defined by at least one of the first linking section and the second linking section.

10. The optical element module according to claim 9, wherein
the at least one leaf spring element being at least one of located in proximity to and located substantially within a contact plane for the surface of the optical element unit, the contact plane being defined by the surface of the contact device.

11. The optical element module according to claim 7, wherein
the tilt axis is a first tilt axis of a first tilt motion of the surface of the contact device and
the contact device is arranged to define a second tilt axis of a second tilt motion of the surface of the contact device, the second tilt motion resulting from a contact force introduced into the surface of the contact device along the line of action of the holding force;
the second tilt axis running transverse to the first tilt axis;
the second tilt axis being at least one of located close to the surface of the contact device and located substantially within the surface of the contact device.

12. The optical element module according to claim 11, wherein at least one of the first tilt axis and the second tilt axis is defined by at least one of the first linking section and the second linking section.

13. The optical element module according to claim 7, wherein at least one of the first linking section and the second linking section comprises at least one elastic hinge element defining the tilt axis.

14. The optical element module according to claim 7, wherein at least one of the first linking section and the second linking section comprises at least one leaf spring element defining the tilt axis.

15. The optical element module according to claim 7, wherein the tilt axis is defined by at least two elastically deformable elements of the contact device.

16. The optical element module according to claim 15, wherein
the contact device comprises two leaf spring elements;
each of the leaf spring elements extending in a leaf spring plane and being arranged such that the leaf spring planes intersect at a line of intersection, the line of intersection defining the tilt axis.

17. The optical element module according to claim 15, wherein
the contact device comprises three elastically deformable strut elements;
each of the strut elements having a strut axis and being arranged such that the strut axes intersect at a point of intersection, the point of intersection defining a point of the tilt axis.

18. The optical element module according to claim 1, wherein the contact device is a clamping device exerting a clamping force as the holding force onto the optical element unit.

19. The optical element module according to claim 1, wherein
the contact device is a bearing device exerting a bearing force as the resulting holding force onto the optical element unit;
the bearing force counteracting at least one of a gravitational force acting on the optical element unit and a clamping force acting on the optical element unit.

20. The optical element module according to claim 1, wherein
the surface of the contact device defining a contact plane for the surface of the optical element unit;
the first linking section being located on one side of the contact plane and the second linking section being located on the other side of the contact plane.

21. The optical element module according to claim 1, wherein
the optical element unit comprises an optical element having an optically used area;
a first part of the optical element located external to the optically used area forming the surface of the optical element unit;
a second part of the optical element located between the optically used area and the first part comprising a stress relief groove.

22. An optical imaging arrangement comprising:
an illumination device,
a mask device adapted to receive a mask,
an optical projection device and
a substrate device adapted to receive a substrate;
the illumination device being adapted to illuminate a pattern formed on the mask,
the optical projection device being adapted to project an image of the pattern onto the substrate;
at least one of the illumination device and the optical projection device comprising an optical element module according to claim 1.

23. A method of holding an optical element unit using a holding force comprising:
providing the optical element unit comprising an optical element, a support device and a contact device having a surface that exerts a holding force along a line of action of the holding force via a surface of the optical element unit, the contact device comprising at least one leaf spring element defining a first linking section and a second linking section arranged kinematically in series between the surface of the contact device and the support device such that a first end of the first linking section is located adjacent to the surface of the contact device and a second end of the first linking section is located adjacent to the second linking section, wherein the first linking section extends from the first end to the second end along a linking direction running transverse to the line of action of the holding force and the second linking section extends along the linking direction;

arranging the first linking section and the second linking section so that they interface in an interface point located substantially within a reference plane while being arranged substantially on opposite sides of the reference plane, the reference plane comprising the line of action of the holding force and running transverse to the linking direction;

further arranging the first linking section and the second linking section such that they undergo a deflection in response to a contact force introduced into the surface of the contact device along the line of action of the holding force, the deflection of the first linking section being such that the interface point is a point of inflection of the at least one leaf spring element and such that, along the linking direction, one of the first and second linking sections is concave and the other of the first and second linking sections is convex; and exerting the holding force.

24. An optical element module, comprising:

an optical element unit comprising an optical element; and a support structure comprising a support device and a contact device connected to the support device, wherein:

a surface of the contact device contacts a surface of the optical element unit and exerts a holding force on the optical element unit along a line of action of the holding force;

the contact device comprises at least one leaf spring element defining first and second linking sections kinematically in series between the surface of the contact device and the support device so that a first end of the first linking section is adjacent to the surface of the contact device and a second end of the first linking section is adjacent to the second linking section;

the first linking section extends from the first end to the second end along a linking direction running transverse to the line of action of the holding force;

the second linking section extends along the linking direction;

the first and second linking sections interface at an interface point located substantially within a reference plane;

the first and second linking sections are arranged substantially on opposite sides of the reference plane;

the reference plane comprises the line of action of the holding force;

the reference plane runs transverse to the linking direction; and the first and second linking sections are elastically deformed in response to a contact force introduced into the surface of the contact device along the line of action of the holding force so that the interface point is a point of inflection of the at least one leaf spring element and so that one of the first and second linking sections has a negative bending moment and the other of the first and second linking sections has a positive bending moment.

25. An optical element module, comprising:

an optical element unit comprising an optical element; and a support structure comprising a support device and a contact device connected to the support device, wherein:

a surface of the contact device contacts a surface of the optical element unit and exerts a holding force on the optical element unit along a line of action of the holding force;

the contact device comprises at least one leaf spring element defining first and second linking sections kinematically in series between the surface of the contact device and the support device so that a first end of the first linking section is adjacent to the surface of the contact device and a second end of the first linking section is adjacent to the second linking section;

the first linking section extends from the first end to the second end along a linking direction running transverse to the line of action of the holding force;

the second linking section extends along the linking direction;

the first and second linking sections interface at an interface point located substantially within a reference plane;

the first and second linking sections are arranged substantially on opposite sides of the reference plane;

the reference plane comprises the line of action of the holding force;

the reference plane runs transverse to the linking direction; and the first and second linking sections are elastically deformed in response to a contact force introduced into the surface of the contact device along the line of action of the holding force so that the interface point is a point of inflection of the at least one leaf spring element where a curvature of the at least one leaf spring element changes from a negative value to a positive value.

* * * * *

UNITED STATES PATENT AND TRADEMARK OFFICE
CERTIFICATE OF CORRECTION

PATENT NO. : 10,215,948 B2
APPLICATION NO. : 13/690227
DATED : February 26, 2019
INVENTOR(S) : Jens Kugler, Ulrich Weber and Dirk Schaffer Page 1 of 1

It is certified that error appears in the above-identified patent and that said Letters Patent is hereby corrected as shown below:

On the Title Page

Column 2, Primary Examiner, delete "Aliciia" and insert -- Alicia --.

In the Specification

Column 6, Line 34, delete "state;" and insert -- state. --.

Column 7, Line 24, delete "disclosure;" and insert -- disclosure. --.

Column 12, Line 65, delete "$A_c$" and insert -- $A_C$ --.

Column 13, Line 18, delete "FIG." and insert -- FIGS. --.

Column 13, Line 36, delete "The" and insert -- the --.

Column 13, Line 37, delete "$F_c$" and insert -- $F_C$ --.

Column 13, Line 40, delete "$F_c$" and insert -- $F_C$ --.

Signed and Sealed this
Twenty-third Day of July, 2019

Andrei Iancu
*Director of the United States Patent and Trademark Office*